(12) United States Patent
Jang et al.

(10) Patent No.: US 10,074,799 B2
(45) Date of Patent: Sep. 11, 2018

(54) MAGNETO-RESISTIVE CHIP PACKAGE INCLUDING SHIELDING STRUCTURE

(71) Applicants: Jae-gwon Jang, Hwaseong-si (KR); Baik-woo Lee, Gwangmyeong-si (KR); Young-jae Kim, Hwaseong-si (KR)

(72) Inventors: Jae-gwon Jang, Hwaseong-si (KR); Baik-woo Lee, Gwangmyeong-si (KR); Young-jae Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/140,464

(22) Filed: Apr. 27, 2016

(65) Prior Publication Data

US 2016/0322562 A1 Nov. 3, 2016

(30) Foreign Application Priority Data

Apr. 29, 2015 (KR) .......................... 10-2015-0060724

(51) Int. Cl.
*H01L 43/08* (2006.01)
*H01L 23/552* (2006.01)
(Continued)

(52) U.S. Cl.
CPC ............ *H01L 43/08* (2013.01); *H01L 23/049* (2013.01); *H01L 23/051* (2013.01);
(Continued)

(58) Field of Classification Search
CPC . H01L 2924/00014; H01L 2924/00012; H01L 2924/181; H01L 2924/3025;
(Continued)

(56) References Cited

U.S. PATENT DOCUMENTS

| 5,159,294 A * | 10/1992 | Ishikawa ................. H01P 1/387 174/549 |
| 5,561,265 A * | 10/1996 | Livshits .................. H01L 23/08 174/386 |

(Continued)

FOREIGN PATENT DOCUMENTS

| JP | 2759395 | 3/1998 |
| JP | 2004221463 | 8/2004 |

(Continued)

OTHER PUBLICATIONS

US 8,884,408, 11/2014, Gu et al. (withdrawn)

(Continued)

*Primary Examiner* — Sophia Nguyen
(74) *Attorney, Agent, or Firm* — Renaissance IP Law Group LLP

(57) ABSTRACT

In one embodiment, a magneto-resistive chip package includes a circuit board; a shielding body including a shielding base part positioned on the circuit board and a shielding intermediate part extending from one side of the shielding base part; a magneto-resistive chip positioned on the shielding base part and including a magneto-resistive cell array; an internal connection part electrically connecting the magneto-resistive chip to the circuit board; an encapsulation part encapsulating the magneto-resistive chip on the circuit board, and having an upper surface that is higher than an upper surface of the magneto-resistive chip; and a shielding cover positioned on the shielding intermediate part, and on the encapsulation part.

19 Claims, 31 Drawing Sheets

(51) Int. Cl.
*H01L 23/00* (2006.01)
*H01L 23/31* (2006.01)
*H01L 23/10* (2006.01)
*H01L 23/14* (2006.01)
*H01L 23/049* (2006.01)
*H01L 23/29* (2006.01)
*H01L 23/051* (2006.01)
*H01L 23/055* (2006.01)
*H01L 23/06* (2006.01)
*H01L 43/12* (2006.01)

(52) U.S. Cl.
CPC ............ *H01L 23/055* (2013.01); *H01L 23/06* (2013.01); *H01L 23/10* (2013.01); *H01L 23/14* (2013.01); *H01L 23/293* (2013.01); *H01L 23/3128* (2013.01); *H01L 23/3142* (2013.01); *H01L 23/552* (2013.01); *H01L 24/32* (2013.01); *H01L 24/49* (2013.01); *H01L 24/73* (2013.01); *H01L 24/48* (2013.01); *H01L 43/12* (2013.01); *H01L 2224/16227* (2013.01); *H01L 2224/32245* (2013.01); *H01L 2224/48091* (2013.01); *H01L 2224/48108* (2013.01); *H01L 2224/48245* (2013.01); *H01L 2224/4912* (2013.01); *H01L 2224/73265* (2013.01); *H01L 2924/00014* (2013.01); *H01L 2924/1443* (2013.01); *H01L 2924/15311* (2013.01); *H01L 2924/1815* (2013.01); *H01L 2924/3025* (2013.01)

(58) Field of Classification Search
CPC ... H01L 2924/1435; H01L 2924/15153; H01L 2924/19043; H01L 2924/1443; H01L 2224/48091; H01L 2224/48108; H01L 2224/48245; H01L 2224/32245; H01L 2224/4824; H01L 23/552; H01L 23/49503; H01L 23/3135; H01L 23/585; H01L 43/02; H01L 43/12; H01L 2224/45099; H01L 43/08; H01L 2224/05553; H01L 2224/05554; H01L 24/73; H01L 21/563; H01L 21/565; H05K 1/0233; H05K 9/0075; H05K 9/0088
See application file for complete search history.

(56) References Cited

U.S. PATENT DOCUMENTS

| | | | |
|---|---|---|---|
| 5,614,694 A * | 3/1997 | Gorenz, Jr. | H05K 9/0026 174/375 |
| 5,939,772 A | 8/1999 | Hurst et al. | |
| 6,097,080 A | 8/2000 | Nakanishi et al. | |
| 6,625,040 B1 | 9/2003 | Tuttle | |
| 6,657,246 B2 | 12/2003 | Ono et al. | |
| 6,940,153 B2 * | 9/2005 | Spencer | B82Y 10/00 257/294 |
| 6,967,390 B2 | 11/2005 | Johnson | |
| 7,030,469 B2 * | 4/2006 | Mahadevan | H01L 21/561 257/659 |
| 7,078,243 B2 | 7/2006 | Spielberger et al. | |
| 7,327,015 B2 * | 2/2008 | Yang | H01L 23/045 257/660 |
| 7,342,303 B1 * | 3/2008 | Berry | H01L 23/29 257/703 |
| 7,548,430 B1 * | 6/2009 | Huemoeller | H01L 21/4857 174/262 |
| 7,550,857 B1 * | 6/2009 | Longo | H01L 24/19 257/686 |
| 7,576,415 B2 * | 8/2009 | Cha | H01L 23/29 257/659 |
| 7,598,596 B2 | 10/2009 | Molla et al. | |
| 7,795,708 B2 | 9/2010 | Katti | |
| 7,829,980 B2 | 11/2010 | Molla et al. | |
| 7,851,894 B1 * | 12/2010 | Scanlan | H01L 23/3128 257/659 |
| 7,898,066 B1 * | 3/2011 | Scanlan | H01L 24/97 257/422 |
| 8,110,902 B2 * | 2/2012 | Eun | H01L 23/055 257/659 |
| 8,178,956 B2 * | 5/2012 | Do | H01L 23/552 257/659 |
| 8,269,319 B2 | 9/2012 | Honer et al. | |
| 8,362,598 B2 * | 1/2013 | Park | H01L 23/3107 257/660 |
| 8,378,466 B2 * | 2/2013 | Chiu | H01L 21/568 257/508 |
| 8,415,775 B2 * | 4/2013 | Katti | H01L 23/13 257/659 |
| 8,466,539 B2 | 6/2013 | Li et al. | |
| 8,497,156 B2 * | 7/2013 | Moriya | H01L 23/29 257/659 |
| 8,552,539 B1 * | 10/2013 | Foster | H01L 21/56 257/659 |
| 8,598,690 B2 * | 12/2013 | Chandra | H01L 21/561 174/377 |
| 8,652,880 B2 | 2/2014 | Bando et al. | |
| 8,653,674 B1 * | 2/2014 | Darveaux | H01L 21/568 257/659 |
| 8,704,341 B2 * | 4/2014 | Lin | H01L 23/49805 257/659 |
| 8,749,033 B2 * | 6/2014 | Watanabe | H01L 23/13 257/200 |
| 8,890,329 B2 * | 11/2014 | Kim | H01L 25/0657 257/621 |
| 8,946,886 B1 * | 2/2015 | Fuentes | H01L 23/36 257/678 |
| 9,007,273 B2 * | 4/2015 | Liao | H01L 23/481 343/841 |
| 9,236,356 B2 * | 1/2016 | Yang | H01L 23/49838 |
| 9,893,020 B2 * | 2/2018 | Lee | H01L 23/552 |
| 2002/0089832 A1 | 7/2002 | Huang | H01L 21/565 361/760 |
| 2002/0145902 A1 * | 10/2002 | Kunikiyo | B82Y 10/00 365/97 |
| 2005/0067676 A1 * | 3/2005 | Mahadevan | H01L 21/561 257/659 |
| 2006/0205177 A1 * | 9/2006 | Smith | H01L 23/5225 438/455 |
| 2006/0289970 A1 | 12/2006 | Gogl et al. | |
| 2011/0018114 A1 * | 1/2011 | Pagaila | H01L 21/561 257/686 |
| 2012/0061816 A1 * | 3/2012 | Song | H01L 23/3128 257/696 |
| 2012/0193737 A1 | 8/2012 | Pang et al. | |
| 2013/0249024 A1 * | 9/2013 | Saida | H01L 43/08 257/421 |
| 2013/0256819 A1 * | 10/2013 | Watanabe | H01L 43/02 257/422 |
| 2014/0042568 A1 | 2/2014 | Yamakawa | |
| 2014/0197505 A1 | 7/2014 | Zhou et al. | |
| 2014/0225208 A1 * | 8/2014 | Gu | H01L 43/02 257/422 |
| 2015/0069545 A1 * | 3/2015 | Noma | H01L 23/552 257/421 |
| 2015/0084141 A1 * | 3/2015 | Fujimori | H01L 23/552 257/421 |
| 2015/0221598 A1 * | 8/2015 | Lee | H01L 27/228 257/295 |
| 2015/0235966 A1 * | 8/2015 | Ohhashi | H01L 23/552 257/659 |
| 2015/0333018 A1 * | 11/2015 | Kim | H01L 43/02 257/422 |
| 2016/0093795 A1 * | 3/2016 | Arai | H01L 23/552 257/422 |
| 2016/0093796 A1 * | 3/2016 | Arai | H01L 43/02 257/422 |

(56) References Cited

U.S. PATENT DOCUMENTS

| | | | |
|---|---|---|---|
| 2016/0172580 A1* | 6/2016 | Matsubara | H01L 23/552 |
| | | | 257/422 |
| 2016/0284761 A1* | 9/2016 | Zhou | H01L 43/02 |
| 2016/0284981 A1* | 9/2016 | Bhushan | H01L 23/552 |
| 2016/0322562 A1* | 11/2016 | Jang | H01L 43/08 |
| 2017/0047507 A1* | 2/2017 | Seo | H01L 23/552 |
| 2017/0069828 A1* | 3/2017 | Lee | H01L 23/552 |
| 2017/0287849 A1* | 10/2017 | Takaku | H01L 23/552 |
| 2018/0006212 A1* | 1/2018 | Fujimori | H01L 43/02 |

FOREIGN PATENT DOCUMENTS

| | | |
|---|---|---|
| JP | 2004303959 | 10/2004 |
| JP | 3879576 | 11/2006 |
| KR | 101342829 A | 1/2014 |
| KR | 20140081548 | 7/2014 |

OTHER PUBLICATIONS

Watanabe, Takahito et al., "A Novel U-shaped Magnetic Shield for Perpendicular MRAM," 2012 IEEE 62nd Electronic Components and Technology Conference, pp. 920-925.

* cited by examiner

MAGNETO-RESISTIVE CHIP PACKAGE INCLUDING SHIELDING STRUCTURE

CROSS-REFERENCE TO RELATED APPLICATIONS

This application claims the benefit of Korean Patent Application No. 10-2015-0060724, filed on Apr. 29, 2015, in the Korean Intellectual Property Office, the disclosure of which is incorporated herein in its entirety by reference.

BACKGROUND

The present disclosure relates to magneto-resistive chip packages, and more particularly, to a magneto-resistive chip package including a shielding structure.

It is desirable for a semiconductor package to have a high-capacity data processing ability while its size is decreased. There has been a strong demand to increase an operation speed and a degree of integration of a chip used for the semiconductor package. To meet this demand, magneto-resistive chips, for example, magneto-resistive random access memory or magnetic random access memory (MRAM), accomplishing a memory function by using a resistance change due to a change in the polarity of a magnetic material, have been proposed.

Since magneto-resistive chips have a risk that stored information is lost due to a change in the polarity of a magnetic material caused by an external magnetic field, a package including a magneto-resistive chip, namely, a magneto-resistive chip package, requires a shielding structure capable of substantially reducing the influence of the external magnetic field upon the magneto-resistive chip package.

SUMMARY

The inventive concept provides a magneto-resistive chip package including a shielding structure capable of decreasing a thickness of the package and increasing a shielding area.

In one embodiment, a magneto-resistive chip package comprises a circuit board; a shielding body arranged on the circuit board, the shielding body comprising a shielding base part and a shielding intermediate part extending from one side of the shielding base part, the shielding body having an opening or gap formed through the shielding base part or through the shielding intermediate part; a magneto-resistive chip arranged on the shielding base part; and an internal connection part electrically connecting the magneto-resistive chip to the circuit board through the opening or gap.

According to an aspect of the inventive concept, there is provided a magneto-resistive chip package including a circuit board; a shielding body comprising a shielding base part positioned on the circuit board and a shielding intermediate part extending from one side of the shielding base part; a magneto-resistive chip positioned on the shielding base part; an internal connection part electrically connecting the magneto-resistive chip to the circuit board; an encapsulation part encapsulating the magneto-resistive chip on the circuit board; and a shielding cover positioned on the shielding intermediate part, and on the encapsulation part.

The shielding base part may be disposed on a portion of the circuit board. The shielding intermediate part may be formed of a plurality of columns spaced apart from each other on one side of the shielding base part.

The shielding intermediate part may be a single contiguous wall extending substantially entirely along one side of the shielding base part. The magneto-resistive cell array may be disposed on a partial region of the magneto-resistive chip, and the shielding base part and the shielding cover may be respectively positioned below and above the magneto-resistive cell array.

The shielding base part may be integrally formed with the shielding intermediate part. An upper surface of the shielding intermediate part may be higher than the upper surface of the magneto-resistive chip. An upper surface of the shielding intermediate part may contact a lower surface of the shielding cover.

The shielding cover may be disposed on substantially the entire area of the circuit board by further extending beyond edge portions of the shielding base part and the shielding intermediate part.

The shielding base part, the shielding intermediate part, and the shielding cover may constitute a shielding structure for protecting the magneto-resistive cell array of the magneto-resistive chip, and the shielding structure may be a single layer of a magnetic material layer or a laminating layer in which a plurality of magnetic material layers and a plurality of non-magnetic material layers are sequentially stacked.

An adhesion layer including a magnetic material may be positioned on the upper surface of the encapsulation part and an upper surface of the shielding intermediate part, and the shielding cover may be positioned on the adhesion layer including the magnetic material.

A recess hole recessed lower than the upper surface of the encapsulation part may be formed in a portion of the encapsulation part that is on the shielding intermediate part, the recess hole may be filled with an adhesion layer including a magnetic material, and the shielding cover may be positioned on the adhesion layer including the magnetic material and the encapsulation part.

A recess hole recessed lower than the upper surface of the encapsulation part may be formed in a portion of the encapsulation part that is on the shielding intermediate part, and the shielding cover may be positioned on the encapsulation part while filling the recess hole.

The shielding base part and the shielding intermediate part may be connected to each other through an adhesion layer including a magnetic material. The internal connection part may be bonding wires that electrically connect the magneto-resistive chip to the circuit board. The shielding base part and the circuit board may be connected to each other through a ground connection part, and thus the shielding base part may be a ground part.

In some embodiments, ends of the shielding cover extend past opposite edges of the shielding intermediate part.

The magneto-resistive cell array may include a magnetic tunnel junction (MTJ) device, and the MTJ device may be a horizontal magnetic device having a horizontal magnetization direction or a vertical magnetic device having a vertical magnetization direction. The MTJ device may be a single MTJ device or a dual MTJ device.

According to another aspect of the inventive concept, there is provided a magneto-resistive chip package including a circuit board; an L-shaped shielding body positioned on the circuit board; a magneto-resistive chip positioned on the L-shaped shielding body; an internal connection part electrically connecting the magneto-resistive chip to the circuit board; an encapsulation part encapsulating the magneto-resistive chip on the circuit board, and having an upper surface higher than an upper surface of the magneto-resistive chip; and a shielding cover positioned on the L-shaped shielding body, and on the encapsulation part.

The L-shaped shielding body may include a shielding base part positioned on the circuit board, and a shielding intermediate part extending from the shielding base part to protrude higher than the upper surface of the magneto-resistive chip. The shielding intermediate part may be formed of a plurality of columns spaced apart from each other on one side of the shielding base part or may be a single contiguous wall extending substantially entirely along one side of the shielding base part.

The shielding cover may be disposed on the entire upper surface of the encapsulation part by extending outward from an upper surface of the L-shaped shielding body. An upper surface of the L-shaped shielding body may contact a lower surface of the shielding cover. The upper surface of the encapsulation part and the lower surface of the shielding cover may be attached to each other via an adhesion layer including a magnetic material.

A recess hole recessed lower than the upper surface of the encapsulation part may be formed in a portion of the encapsulation part that is on the L-shaped shielding body, the recess hole may be filled with an adhesion layer including a magnetic material, and the shielding cover may be positioned on the adhesion layer including the magnetic material.

A recess hole recessed lower than the upper surface of the encapsulation part may be formed in a portion of the encapsulation part that is on the L-shaped shielding body, and the shielding cover may be positioned on the encapsulation part while filling the recess hole.

According to another aspect of the inventive concept, there is provided a magneto-resistive chip package including a circuit board; a substantially straight line-shaped shielding body positioned on the circuit board; a magneto-resistive chip positioned on the substantially straight line-shaped shielding body and comprising a magneto-resistive cell array; an internal connection part electrically connecting the magneto-resistive chip to the circuit board; an encapsulation part encapsulating the magneto-resistive chip on the circuit board, and having an upper surface that is higher than an upper surface of the magneto-resistive chip; and a T-shaped shielding cover comprising a shielding intermediate part extending toward the shielding body within the encapsulation part, and a substantially straight line-shaped shielding part connected to the shielding intermediate part and positioned on the encapsulation part.

The shielding body may be a shielding base part positioned on the circuit board. The shielding intermediate part included in the T-shaped shielding cover may be buried in an aperture formed within the encapsulation part.

The shielding intermediate part may be formed of a plurality of columns spaced apart from each other on one side of the T-shaped shielding cover or may comprise a single contiguous wall extending substantially entirely along one side of the T-shaped shielding cover. The T-shaped shielding cover may be disposed on substantially the entire upper surface of the encapsulation part.

An upper surface of the shielding body and a lower surface of the T-shaped shielding cover may contact each other via an adhesion layer including a magnetic material.

According to another aspect of the inventive concept, there is provided a magneto-resistive chip package including a circuit board; a shielding base part positioned on the circuit board and having a penetration hole (or opening) through which the circuit board is exposed; a magneto-resistive chip positioned on the shielding base part and comprising a magneto-resistive cell array; a shielding intermediate part provided on one side of the shielding base part and protruding higher than an upper surface of the magneto-resistive chip; an internal connection part electrically connecting the magneto-resistive chip to the circuit board via the penetration hole; an encapsulation part encapsulating the magneto-resistive chip on the circuit board; and a shielding cover positioned on the shielding intermediate part and the encapsulation part.

The penetration hole may be positioned on one side of the shielding base part, and the internal connection part may be bonding wires that electrically connect the magneto-resistive chip to the circuit board.

The penetration hole may be positioned on one side of the shielding base part, and the magneto-resistive chip may include a contact electrode as the internal connection part, and the contact electrode is electrically connected to the circuit board via the penetration hole. A plurality of the penetration holes may be provided around the shielding base part.

In one embodiment, a method of forming a chip package includes: arranging a shielding body on a circuit board, the shielding body comprising a shielding base part, the shielding body having an opening formed therethrough; arranging a magneto-resistive chip on the shielding base part; and forming an internal connection part electrically connecting the magneto-resistive chip to the circuit board through the opening.

The method may further include forming an encapsulation part encapsulating the magneto-resistive chip on the circuit board; and arranging a shielding cover on the encapsulation part, the shielding cover overlying the magneto-resistive chip.

The method may further include forming a shielding intermediate part extending between the shielding base part and the shielding cover, the shielding intermediate part comprising a plurality of columns spaced apart from each other and defining the opening therebetween.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
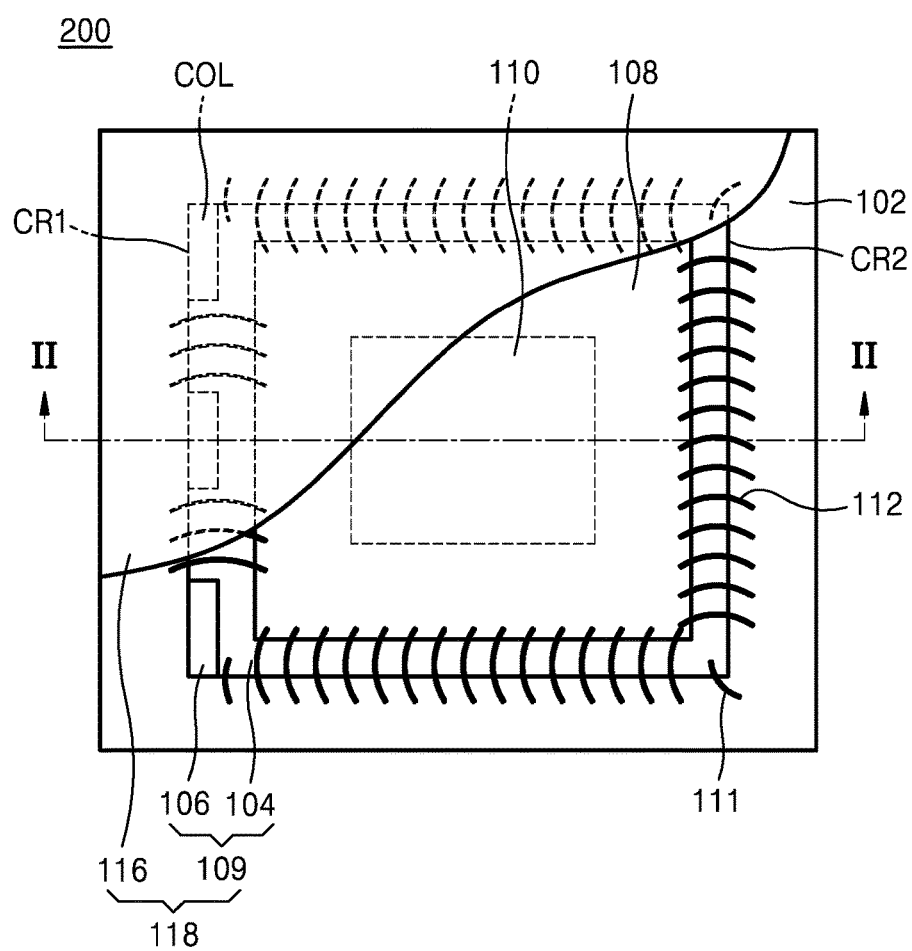
FIG. 1 is a layout view of a magneto-resistive chip package according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. In the drawings, the thicknesses or sizes of layers are exaggerated for clarity and convenience of explanation.

It will be understood that when an element such as a layer, region or wafer (substrate) is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification. As used herein the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "above", "upper", "below", "lower" and the like, may be used herein to describe the relationship of one element or feature to another element(s) or feature(s) as illustrated in the figures. It will be understood that the spatially relative terms are intended to encompass different orientations of a device in use or operation, in addition to the orientation depicted in the figures. For example, if the device in the figures is turned over, elements described as "above" other elements or features would then be oriented "below" the other elements or features. Thus, the exemplary term "above" can encompass both an orientation of above and below. An element may be otherwise oriented (rotated 90 degrees or at other orientations), and the spatially relative descriptors used herein may be interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

The inventive concept will now be described more fully with reference to the accompanying drawings, in which exemplary embodiments of the inventive concept are shown. As such, variations from the shapes of the illustrations as a result, for example, of manufacturing techniques and/or tolerances, are to be expected. Thus, embodiments of the inventive concept should not be construed as being limited to the particular shapes of regions illustrated herein but are to include deviations in shapes that result, for example, from manufacturing. At least two of embodiments below may be combined and implemented.

Figure 2:
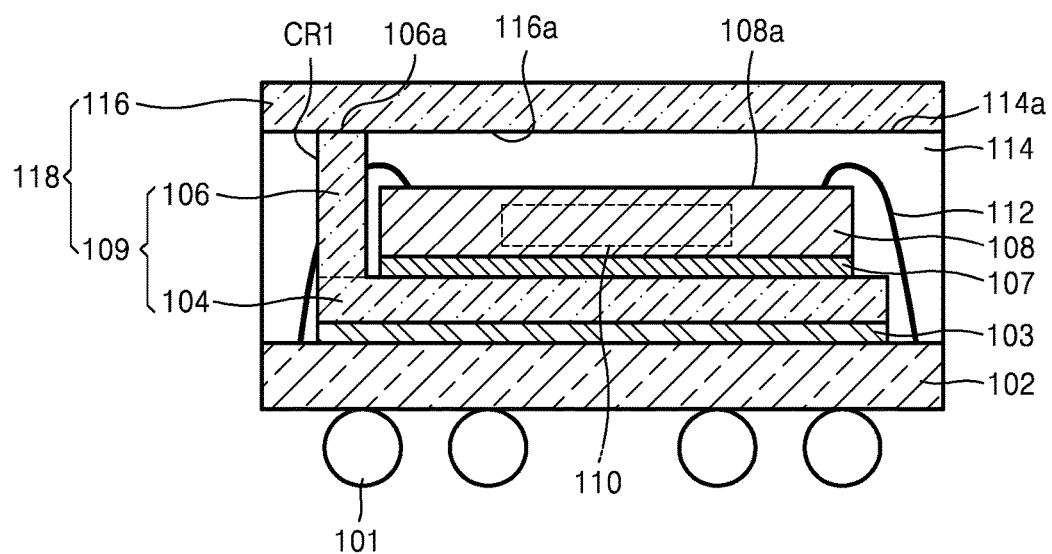
FIG. 2 is a cross-sectional view of major elements taken along line II-II in FIG. 1.
Figure 3:
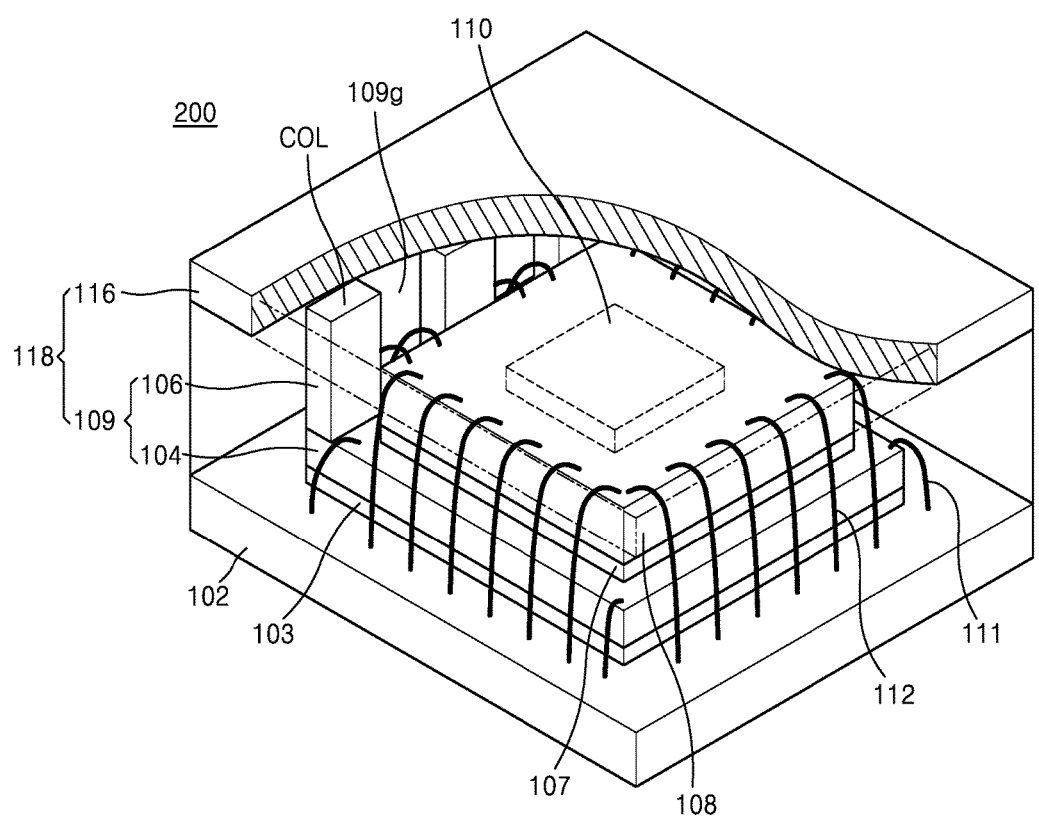
FIG. 3 is a perspective view of the magneto-resistive chip package of FIG. 1.
Figure 4A:
FIGS. 4A and 4B are cross-sectional views of a shielding structure of the magneto-resistive chip package of FIGS. 1-3.
Figure 4B:
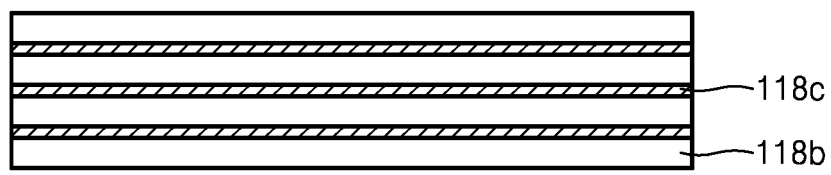

FIG. 1 is a layout view of a magneto-resistive chip package 200 according to an embodiment of the inventive concept. FIG. 2 is a cross-sectional view of major elements of the magneto-resistive chip package 200 taken along line II-II in FIG. 1. FIG. 3 is a perspective view of the magneto-resistive chip package 200 of FIG. 1. FIGS. 4A and 4B are cross-sectional views of a shielding structure of the magneto-resistive chip package 200 of FIGS. 1-3.

In detail, in the magneto-resistive chip package 200, a shielding structure 118 may be positioned on a circuit board 102. The circuit board 102 may be a printed circuit board (PCB). An external connection part 101 capable of being electrically connected to an external device may be positioned on a lower surface of the circuit board 102. The external connection part 101 may be an external connection terminal. The external connection part 101 may be solder balls or other suitable connection means.

As will be described later, the shielding structure 118 may be a component for protecting a magneto-resistive chip 108 from an external magnetic field. As shown in FIG. 4A, the shielding structure 118 may comprise a single layer structure 118SL including a magnetic material layer 118a. As needed, as shown in FIG. 4B, the shielding structure 118 may be a multi-layer structure, i.e., a laminating layer 118RL, in which a plurality of magnetic material layers 118b and a plurality of non-magnetic material layers 118c may be sequentially and repeatedly stacked.

The magnetic material layers 118a, 118b may each comprise a magnetic conductive layer or a magnetic non-conductive layer. The magnetic conductive layer may be formed of, for example, a high permeability material including NixFe1-x or NixMoyFe1-x-y. The magnetic conductive layer may be formed by adding another material, such as copper (Cu) or cobalt (Co), to the above-stated material. The magnetic non-conductive layer may include, for example, a ferrite layer, such as a MnZn-ferrite layer or a NiZn-ferrite layer.

The non-magnetic material layer 118c may be a non-magnetic layer or a non-conductive layer. The non-magnetic layer may be formed of, for example, aluminum or Cu, and the non-conductive layer may be formed of, for example, epoxy resin or a dielectric material.

As shown in FIG. 2, the shielding structure 118 may be provided on the circuit board 102 with a first adhesion layer 103 interposed therebetween. The first adhesion layer 103 may be omitted depending on the application.

A shielding body 109, which is a part of the shielding structure 118, may be positioned on the first adhesion layer 103. The shielding body 109 may have an L-shape cross-section as shown in FIG. 2. The shielding body 109 may include a shielding base part 104 positioned on the circuit board 102, and a shielding intermediate part 106 provided on one side of the shielding base part 104 and connected to the shielding base part 104.

The shielding base part 104 may be integrally formed with the shielding intermediate part 106. The shielding base part 104 may occupy a portion of the entire area of the circuit board 102. If the first adhesion layer 103 is not formed, the shielding base part 104 may be formed on the circuit board 102. In some embodiments, if the shielding base part 104 is a conductive layer, the shielding base part 104 and the circuit board 102 may be connected to each other through a ground connection part 111, and thus the shielding base part 104 may serve as a ground part.

A second adhesion layer 107 may be positioned on the shielding base part 104. The second adhesion layer 107 may be provided if necessary. Alternatively, the second adhesion layer 107 may be omitted. The magneto-resistive chip 108 may include a magneto-resistive cell array 110 and may be positioned on the second adhesion layer 107. If the second adhesion layer 107 is not formed, the magneto-resistive chip 108 may be positioned on the shielding base part 104. The magneto-resistive cell array 110 may be positioned on the shielding base part 104.

The magneto-resistive chip 108 may be magneto-resistive random access memory or magnetic random access memory (MRAM). The magneto-resistive chip 108 may be spin transfer torque-MRAM (STT-MRAM). STT MRAM is a memory device where a magnetization direction of a magnetic tunnel junction (MTJ) device can be controlled by injecting current directly to the MTJ device. In the case of STT MRAM, since an MTJ device may be strongly affected by an external magnetic field, the shielding structure 118 may be necessary.

The magneto-resistive cell array 110 may include a plurality of unit cells, each of which may include an MTJ device. The magneto-resistive cell array 110 may be buried within the magneto-resistive chip 108. The magneto-resistive cell array 110 may be formed within a partial region of the magneto-resistive chip 108. The magneto-resistive cell array 110 may be formed within a center region of the magneto-resistive chip 108. The magneto-resistive cell array 110 may be formed in a peripheral region of the magneto-resistive chip 108, near the edge of the magneto-resistive chip 108. The magneto-resistive chip 108 and the MTJ device will be described later in more detail.

The magneto-resistive chip 108 may be electrically connected to the circuit board 102 via an internal connection part 112. The internal connection part 112 may electrically connect the magneto-resistive chip 108 to the circuit board 102. The internal connection part 112 may be bonding wires.

The shielding intermediate part 106 may be provided on one side of the shielding base part 104. An upper surface 106a of the shielding intermediate part 106 protrudes higher than an upper surface 108a of the magneto-resistive chip 108. The shielding intermediate part 106 may comprise a plurality of columns COL spaced apart from each other on one side of the shielding base part 104.

An encapsulation part 114 for encapsulating the magneto-resistive chip 108 may be formed on the circuit board 102. The encapsulation part 114 may be formed of resin, for example, epoxy resin. The encapsulation part 114 may have an upper surface 114a higher than the upper surface 108a of the magneto-resistive chip 108. The upper surface 114a of the encapsulation part 114 may be located at substantially the same level as the upper surface 106a of the shielding intermediate part 106.

A shielding cover 116, which is a part of the shielding structure 118, may be positioned on the shielding intermediate part 106, the encapsulation part 114, and the magneto-resistive cell array 110. The shielding cover 116 may have a substantially straight line-shaped cross-section as shown in FIG. 2. The shielding cover 116 may be position on the magneto-resistive cell array 110 while contacting the upper surface 106a of the shielding intermediate part 106 and the upper surface 114a of the encapsulation part 114. The upper surface 106a of the shielding intermediate part 106 may contact a lower surface 116a of the shielding cover 116.

The shielding cover 116 may be positioned on the magneto-resistive cell array 110. The shielding cover 116 may extend from outer corners CR1 and CR2 of the shielding base part 104 and the shielding intermediate part 106 to cover substantially the entire area of the circuit board 102.

In the magneto-resistive chip package 200, the shielding structure 118 may surround the magneto-resistive cell array 110 as shown in FIG. 2. Thus, when an external magnetic field is applied to the magneto-resistive chip package 200, the external magnetic field may be channeled through the shielding structure 118, and the impact of the external magnetic field upon the magneto-resistive cell array 110 may be greatly reduced.

In the magneto-resistive chip package 200, the shielding body 109 may include the shielding base part 104 and the shielding intermediate part 106, and the shielding cover 116, which may be separate from each other. Thus, the magneto-resistive chip 108 may be easily placed on the shielding body 109 and, as a result, the magneto-resistive chip package 200 may have a low height, and the magneto-resistive chip 108 and the circuit board 102 may be easily connected to each other via the internal connection part 112.

In the magneto-resistive chip package 200, the shielding cover 116 may extend from the outer corners CR1 and CR2 of the shielding base part 104 and the shielding intermediate part 106 to cover the entire area of the circuit board 102. Accordingly, the magneto-resistive chip package 200 may have a large shielding area capable of protecting the magneto-resistive cell array 110 from an external magnetic field.

Figure 5:
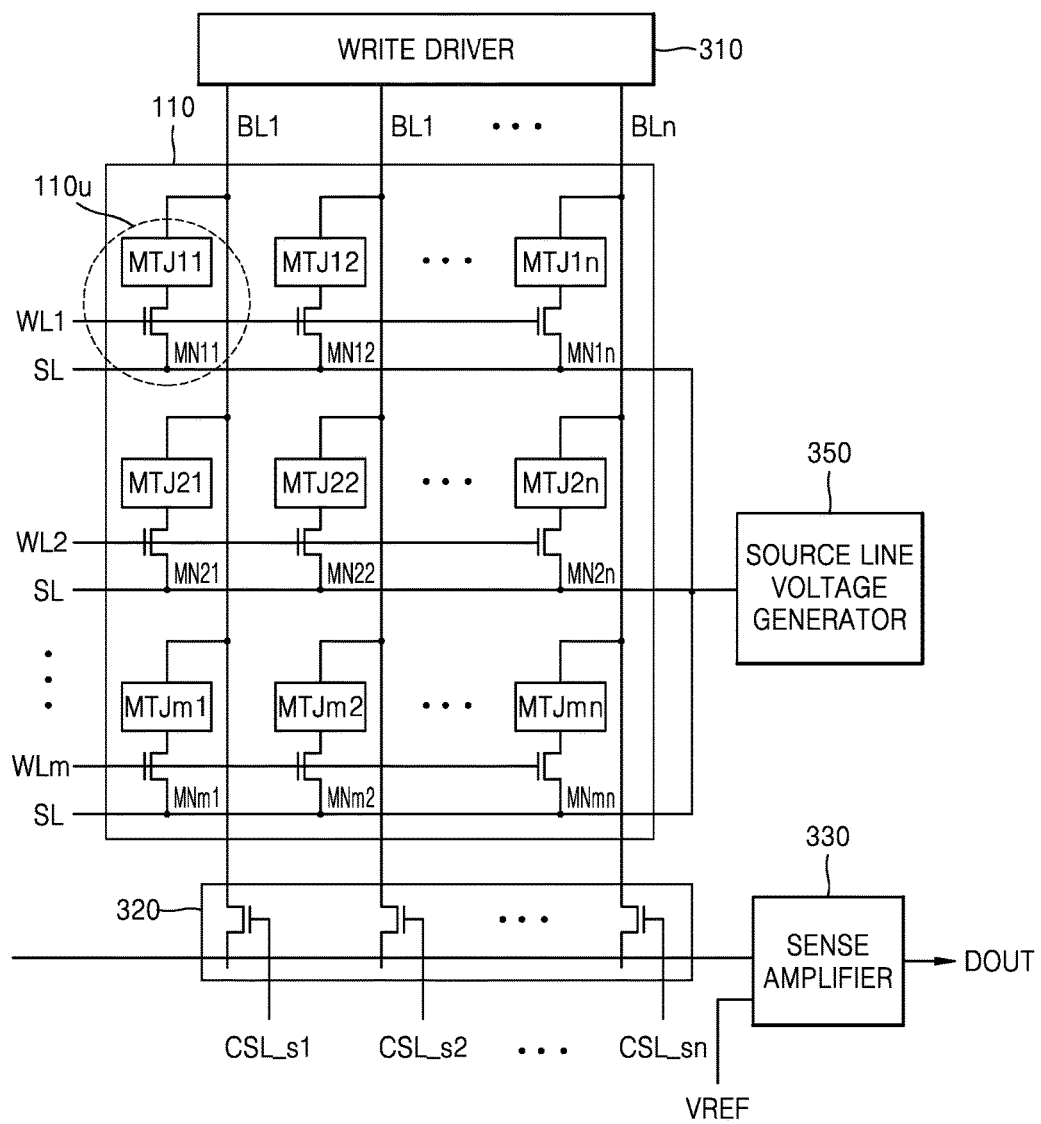
FIG. 5 is a circuit diagram of a magneto-resistive cell array of a magneto-resistive chip which is used in a magneto-resistive chip package according to an embodiment of the inventive concept.

FIG. 5 is a circuit diagram of a magneto-resistive cell array of a magneto-resistive chip, which is used in a magneto-resistive chip package according to an embodiment of the inventive concept.

The magneto-resistive cell array 110 may be a memory cell array. The magneto-resistive cell array 110 may be connected to a write driver 310, a selection circuit 320, a source line voltage generator 350, and a sense amplifier 330.

The magneto-resistive cell array 110 may include a plurality of magneto-resistive cells 110u. The magneto-resistive cell array 110 may include a plurality of word lines WL1 through WLm and a plurality of bit lines BL1 through BLn. A magneto-resistive cell 110u may be disposed between each of the word lines WL1 through WLm and each of the bit lines BL1 through BLn.

The magneto-resistive cell array 110 may include cell transistors MN11 through MNmn having gates connected to the word lines WL1 through WLm, and MTJ devices MTJ11 through MTJmn respectively connected between the cell transistors MN11 through MNmn and the bit lines BL1 through BLn.

Respective sources of cell transistors MN11 through MN1n may be connected to a source line SL. The selection circuit 320 may selectively connect the bit lines BL1 through BLn to the sense amplifier 330 in response to column selection signals CSL_s1 through CSL_sn. The sense amplifier 330 may generate output data DOUT by amplifying a difference between an output voltage signal of the selection circuit 320 and a reference voltage VREF.

The write driver 310 is connected to the bit lines BL1 through BLn, and generates a program current based on write data and provides the program current to the bit lines BL1 through BLn. To magnetize the MTJ devices MTJ11 through MTJmn of the magneto-resistive cell array 110, a voltage that is higher than a voltage applied to the bit lines BL1 through BLn may be applied to source lines SL. The source line voltage generator 350 may generate a source line driving voltage VSL and provide the source line driving voltage VSL to the source lines SL of the magneto-resistive cell array 110.

Figure 6A:
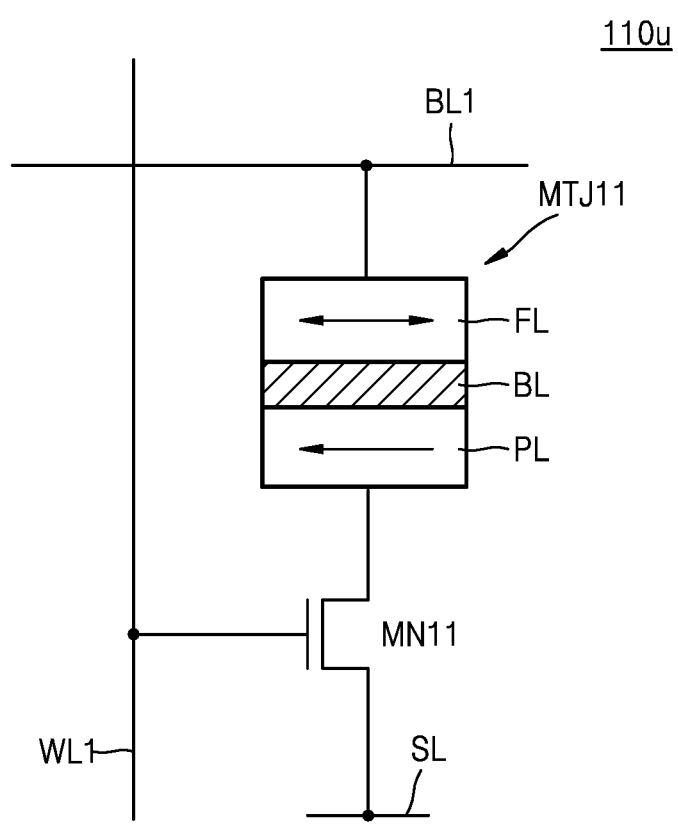
FIG. 6A is a circuit diagram of a magneto-resistive cell included in the magneto-resistive cell array of FIG. 5.
Figure 6B:
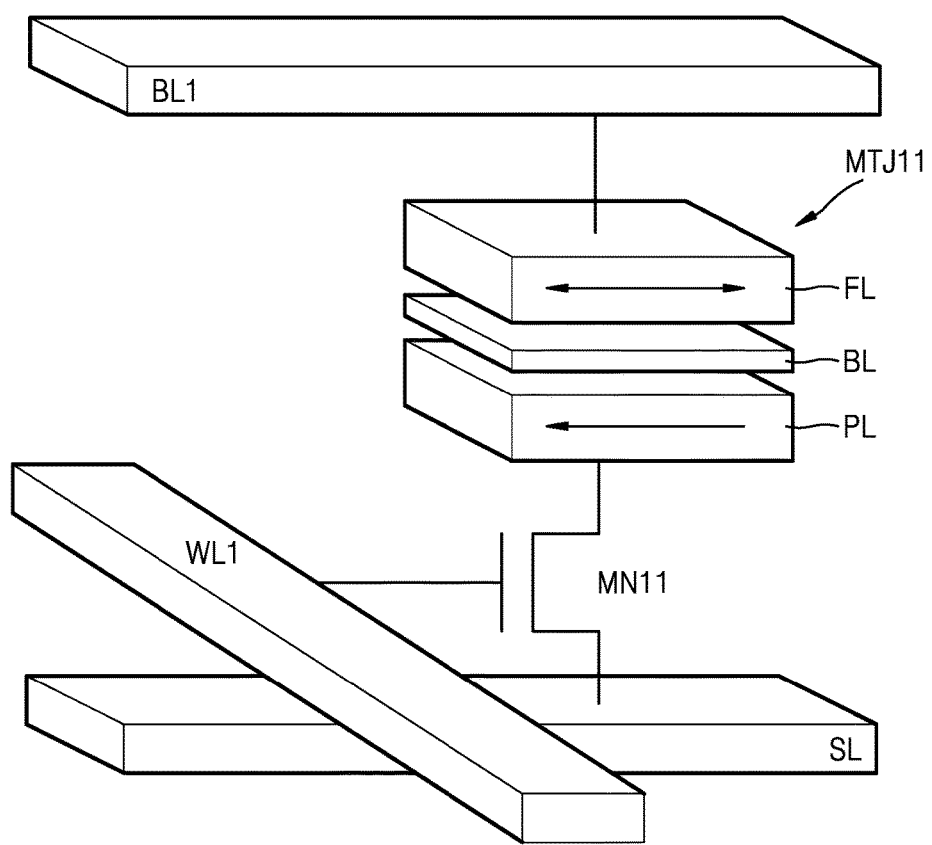
FIG. 6B is a perspective view of the magneto-resistive cell of FIG. 6A.

FIG. 6A is a circuit diagram of a magneto-resistive cell 110u of FIG. 5, and FIG. 6B is a perspective view of the magneto-resistive cell 110u of FIG. 6A.

In detail, as shown in FIG. 6A, the magneto-resistive cell 110u may include a cell transistor MN11 formed of an NMOS transistor, and an MTJ device MTJ11. The cell transistor MN11 has a gate connected to the word line WL1, and a source connected to the source line SL. The MTJ device MTJ11 is connected between a drain of the cell transistor MN11 and the bit line BL1.

As shown in FIG. 6B, the MTJ device MTJ11 may include a pinned layer PL having a pinned uniform magnetization direction, a free layer FL that is magnetized in the direction of an externally applied magnetic field, and a tunnel barrier layer BL interposed between the pinned layer PL and the free layer FL and formed of an insulating film.

The MTJ device MTJ11 of FIG. 6B may be a cell that constitutes STT-MRAM. To perform a write operation with respect to STT-MRAM, the cell transistor MN11 may be turned on by applying a logic high voltage to the word line WL1, and a write current may be applied to between the bit line BL1 and the source line SL. To perform a read operation with respect to STT-MRAM, the cell transistor MN11 may be turned on by applying a logic high voltage to the word line WL1, a read current may be applied from the bit line BL1 toward the source line SL, and data stored in the magneto-resistive cell 110u may be determined or detected according to a resistance value of the MTJ device MTJ11 with respect to the read current.

The resistance value of the MTJ device MTJ11 varies according to the magnetization direction of the free layer FL. For example, the magnetization direction of the free layer FL and that of the pinned layer PL may be parallel to each other in the MTJ device MTJ11. In this case, the MTJ device MTJ11 may have a low-resistance value and read data "0". The magnetization direction of the free layer FL and that of the pinned layer PL may be anti-parallel to each other in the MTJ device MTJ11. In this case, the MTJ device MTJ11 may have a high-resistance value and read data "1".

In FIGS. 6A and 6B, the MTJ device MTJ11 is a horizontal magnetic device in which the magnetization directions of a free layer FL and a pinned layer PL are horizontal. However, according to another embodiment, as described later, the MTJ device MTJ11 may be a vertical magnetic device in which magnetization directions of a free layer FL and a pinned layer PL are vertical.

Figure 7A:
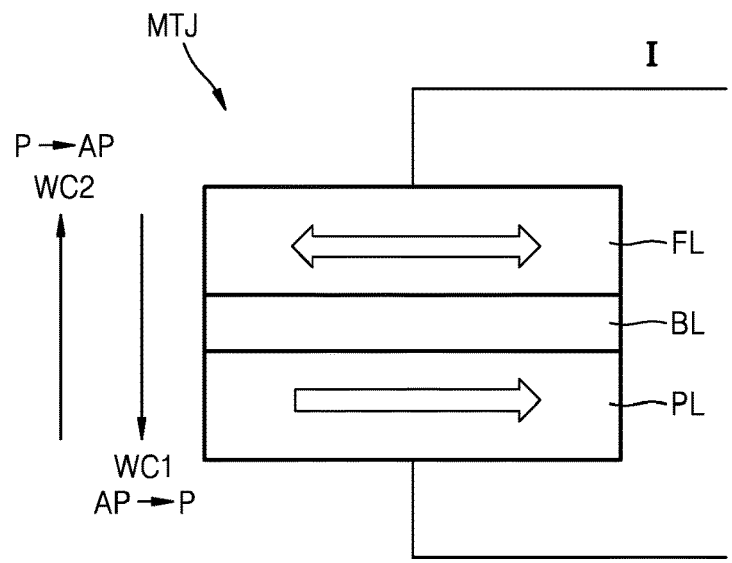
FIGS. 7A and 7B explain write operations of an MTJ device that is included in the magneto-resistive cell of FIG. 5.
Figure 7B:
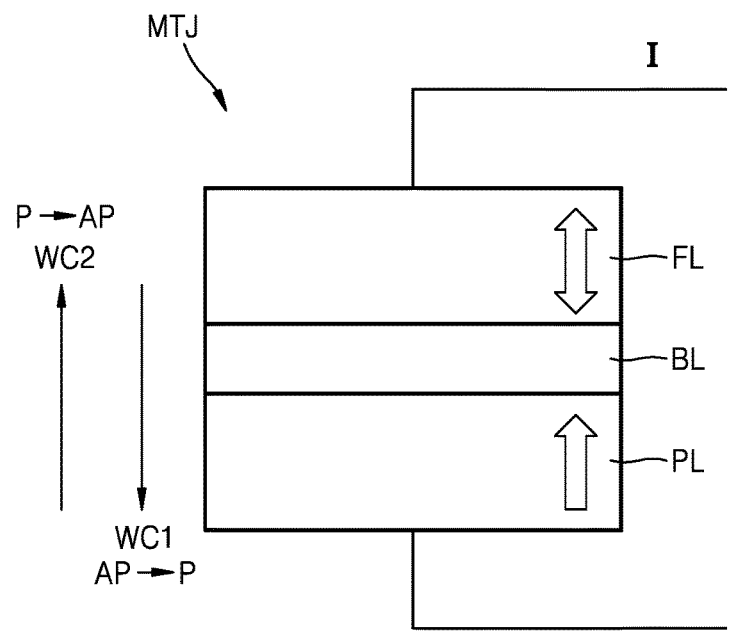

FIGS. 7A and 7B explain write operations of an MTJ device MTJ that is included in each magneto-resistive cell 100u of FIG. 5.

In detail, the MTJ device MTJ of FIG. 7A is a horizontal magnetic device in which magnetization directions of a free layer FL and a pinned layer PL are horizontal. The MTJ device MTJ having a horizontal magnetization direction may be a case where a moving direction of current and a magnetization easy axis are substantially vertical. The MTJ device MTJ of FIG. 7B is a vertical magnetic device in which magnetization directions of a free layer FL and a pinned layer PL are vertical. The MTJ device MTJ having a vertical magnetization direction may be a case where a moving direction of current and a magnetization easy axis are substantially horizontal.

The magnetization direction of the free layer FL may be determined according to the directions of first and second write currents WC1 and WC2 that flow within the MTJ device MTJ. For example, when the first write current WC1 is applied from the free layer FL to the pinned layer PL, free electrons having the same spin direction as the pinned layer PL apply a torque to the free layer FL. Accordingly, the free layer FL is magnetized in parallel to (indicated by reference character P) the pinned layer PL.

When the second write current WC2 is applied from the pinned layer PL to the free layer FL, free electrons having an opposite spin direction to the pinned layer PL return to the free layer FL and apply a torque to the free layer FL. Accordingly, the free layer FL is magnetized in a direction anti-parallel to (indicated by reference character AP) the pinned layer PL. In other words, in the MTJ device MTJ, the magnetization direction of the free layer FL may vary according to an STT.

FIGS. 8A-8E illustrate various embodiments of an MTJ device that is included in each magneto-resistive cell 100u of FIG. 5.

Figure 8A:
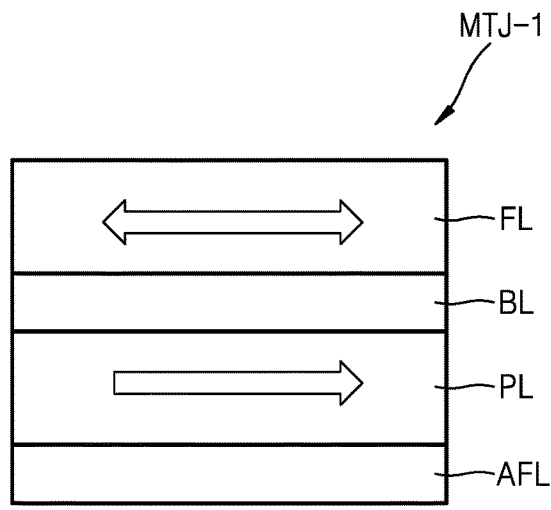
FIGS. 8A-8E illustrate various embodiments of an MTJ device that is included in the magneto-resistive cell of FIG. 5.

Referring to FIG. 8A, an MTJ device MTJ-1 may include a free layer FL, a tunnel barrier layer BL, a pinned layer PL, and an anti-ferromagnetic layer AFL. The anti-ferromagnetic layer AFL may not be included. The free layer FL may include a material having a variable magnetization direction. The magnetization direction of the free layer FL may be changed according to an electrical/magnetic factor that is provided from the inside and/or outside of the magneto-resistive cell. The free layer FL may include a ferromagnetic material including at least one selected from cobalt (Co), iron (Fe), and nickel (Ni). For example, the free layer FL may include at least one selected from FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel barrier layer BL may have a thickness that is less than a spin diffusion distance. The tunnel barrier layer BL may include a non-magnetic material. For example, the tunnel barrier layer BL may include at least one material selected from magnesium (Mg), titanium (Ti), aluminum (Al), oxide of Mg-zinc (MgZn), oxide of Mg-boron (MgB), nitride of Ti, and nitride of vanadium (V).

The pinned layer PL may have a magnetization direction that is fixed by the anti-ferromagnetic layer AFL. The pinned layer PL may include a ferromagnetic material. For example, the pinned layer PL may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer AFL may include an anti-ferromagnetic material. For example, the anti-ferromagnetic layer AFL may include at least one selected from PtMn, IrMn, MnO, MnS, MnTe, $MnF_2$, $FeCl_2$, FeO, $CoCl_2$, CoO, $NiCl_2$, NiO, and Cr.

Figure 8B:
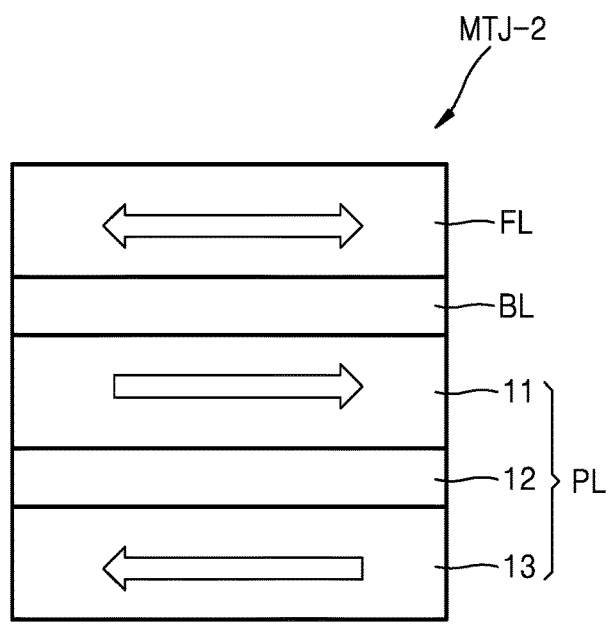

Referring to FIG. 8B, a pinned layer PL of an MTJ device MTJ-2 is formed of a synthetic anti-ferromagnetic (SAF) material. The pinned layer PL may include a first ferromagnetic layer 11, a coupling layer 12, and a second ferromagnetic layer 13. For example, each of the first and second ferromagnetic layers 11 and 13 may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In this case, the first ferromagnetic layer 11 and the second ferromagnetic layer 13 may have different magnetization directions, and the magnetization direction of each of the first and second ferromagnetic layers 11 and 13 may be fixed. The coupling layer 12 may include ruthenium (Ru).

Figure 8C:
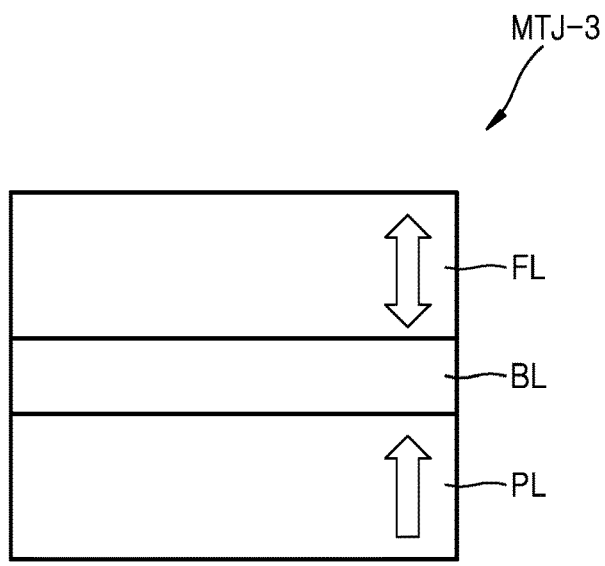

Referring to FIG. 8C, to obtain an MTJ device MTJ-3 having a vertical magnetization direction, a free layer FL and a pinned layer PL may be formed of materials having high magnetic anisotropy energy. Examples of the materials having high magnetic anisotropy energy include an amorphous rare-earth element alloy, and a multi-layered thin film such as $(Co/Pt)_n$ or $(Fe/Pt)_n$. Here, n is a positive integer. For example, the free layer FL may be an ordered alloy, and may include at least one selected from Fe, Co, Ni, palladium (Pd), and platinum (Pt). For example, the free layer FL may include at least one selected from a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. These alloys may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$, when being chemically quantitatively represented.

The pinned layer PL may be an ordered alloy, and may include at least one selected from Fe, Co, Ni, Pd, and Pt. For example, the pinned layer PL may include at least one selected from a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. These alloys may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$, when being chemically quantitatively represented.

Figure 8D:
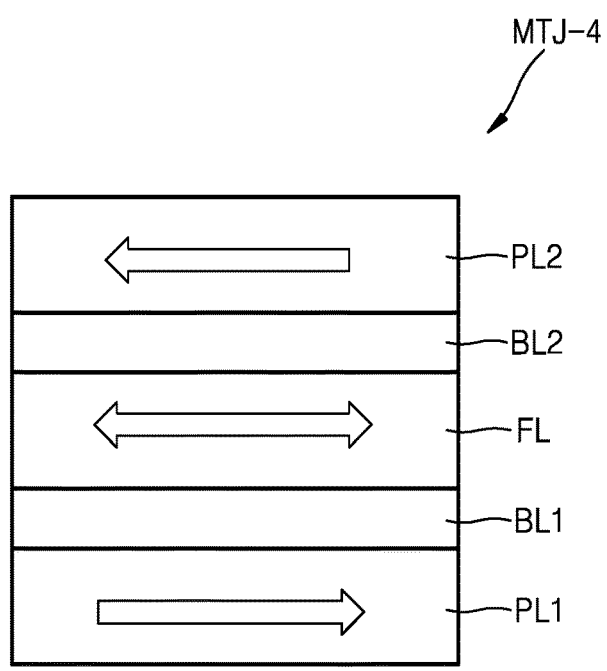
Figure 8E:
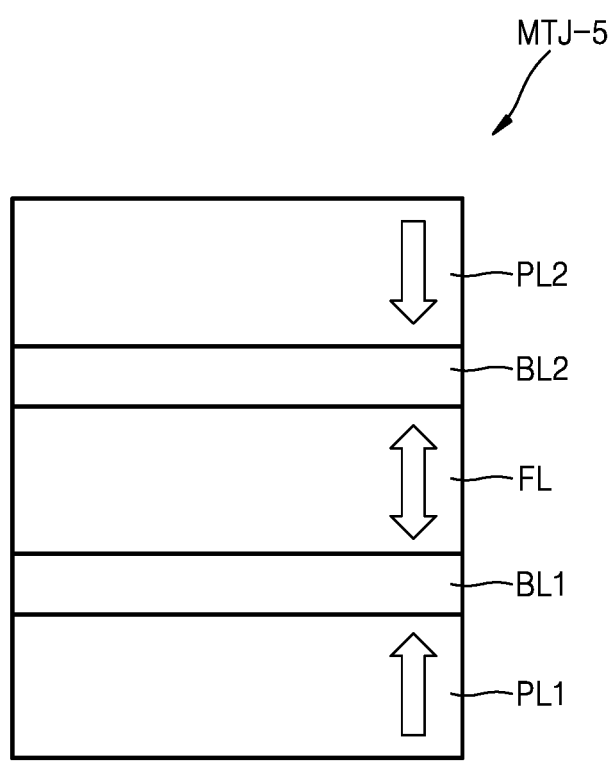

FIGS. 8D and 8E illustrate dual MTJ devices MTJ-4 and MTJ-5. Each of the dual MTJ device MTJ-4 and MTJ-5 includes a free layer FL and first and second tunnel barrier layers BL2 and BL1 and first and second pinned layers PL2 and PL1 respectively disposed on both ends of the free layer FL.

Referring to FIG. 8D, the dual MTJ device MTJ-4 may form horizontal magnetism and may include a first pinned layer PL2, a first tunnel barrier layer BL2, a free layer FL, a second tunnel barrier layer BL1, and a second pinned layer PL1. The materials used to form the free layer FL, the first and second tunnel barrier layers BL2 and BL1, and the first and second pinned layers PL2 and PL1 may be respectively the same as or similar to those used to form the free layer FL, the tunnel barrier layer BL, and the pinned layer PL of FIG. 8A. If a magnetization direction of the first pinned layer PL2 and a magnetization direction of the second pinned layer PL1 are fixed to be opposite directions, magnetic forces may be substantially offset by the first and second pinned layers PL2 and PL1. Accordingly, the dual MTJ device MTJ-4 may perform a write operation by using less current than the MTJ device MTJ-1. The dual MTJ device MTJ-4 may obtain an accurate data value because the dual MTJ device MTJ-4 provides a higher resistance during a read operation due to the second tunnel barrier layer BL1.

Referring to FIG. 8E, the dual MTJ device MTJ-5 forms vertical magnetism and includes a first pinned layer PL2, a first tunnel barrier layer BL2, a free layer FL, a second tunnel barrier layer BL1, and a second pinned layer PL1. The materials used to form the free layer FL, the first and second tunnel barrier layers BL2 and BL1, and the first and second pinned layers PL2 and PL1 may be respectively the same as or similar to those used to form the free layer FL, the tunnel barrier layer BL, and the pinned layer PL of FIG. 8C. If a magnetization direction of the first pinned layer PL2 and a magnetization direction of the second pinned layer PL1 are fixed to be opposite directions, magnetic forces may be substantially offset by the first and second pinned layers PL2 and PL1. Accordingly, the dual MTJ device MTJ-5 may perform a write operation by using less current than the MTJ device MTJ-3.

Figure 9:
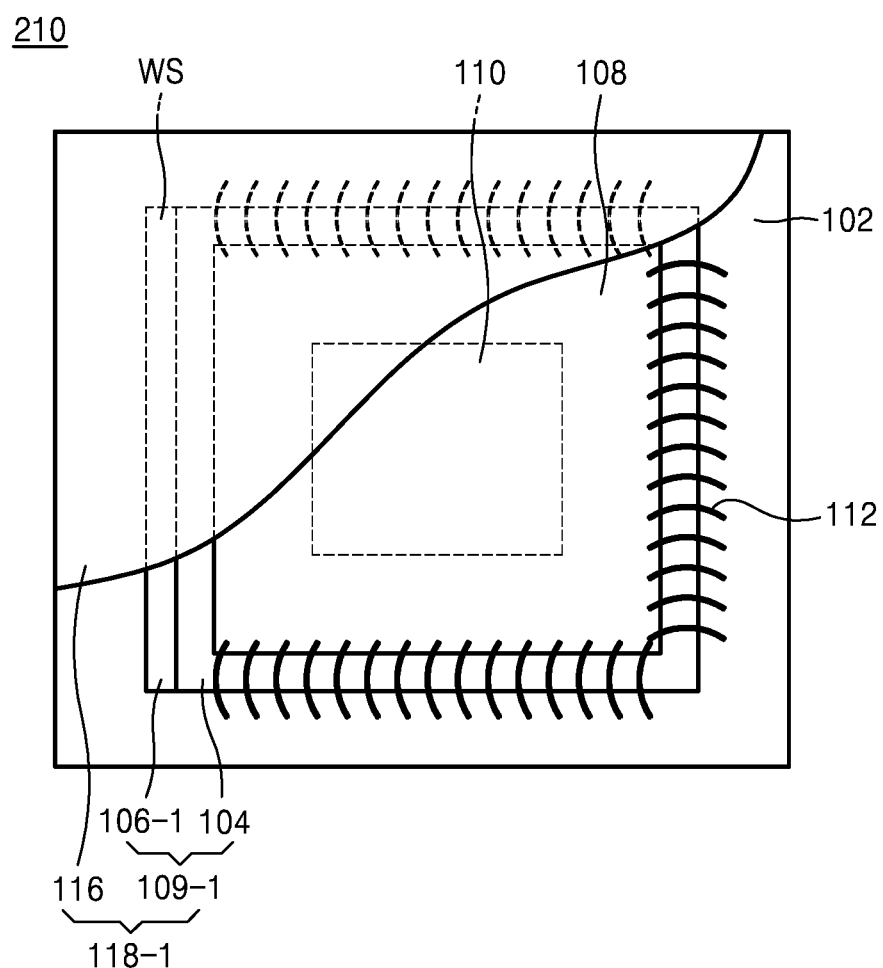
FIG. 9 is a layout view of a magneto-resistive chip package according to an embodiment of the inventive concept.
Figure 10:
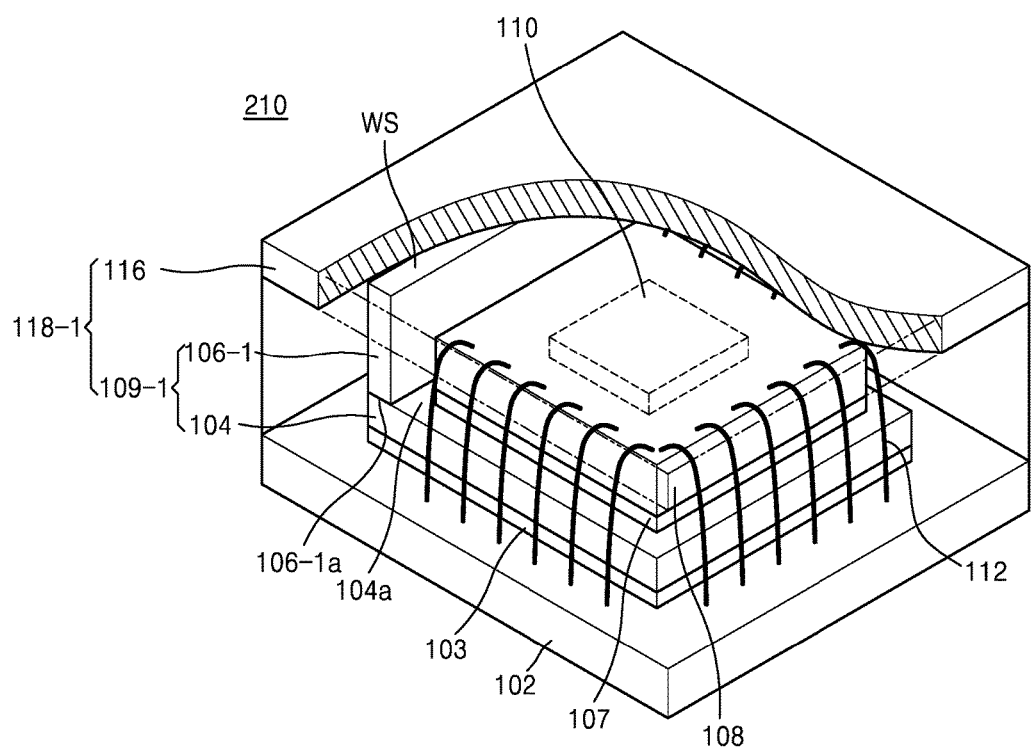
FIG. 10 is a perspective view of the magneto-resistive chip package of FIG. 9.
Figure 11:
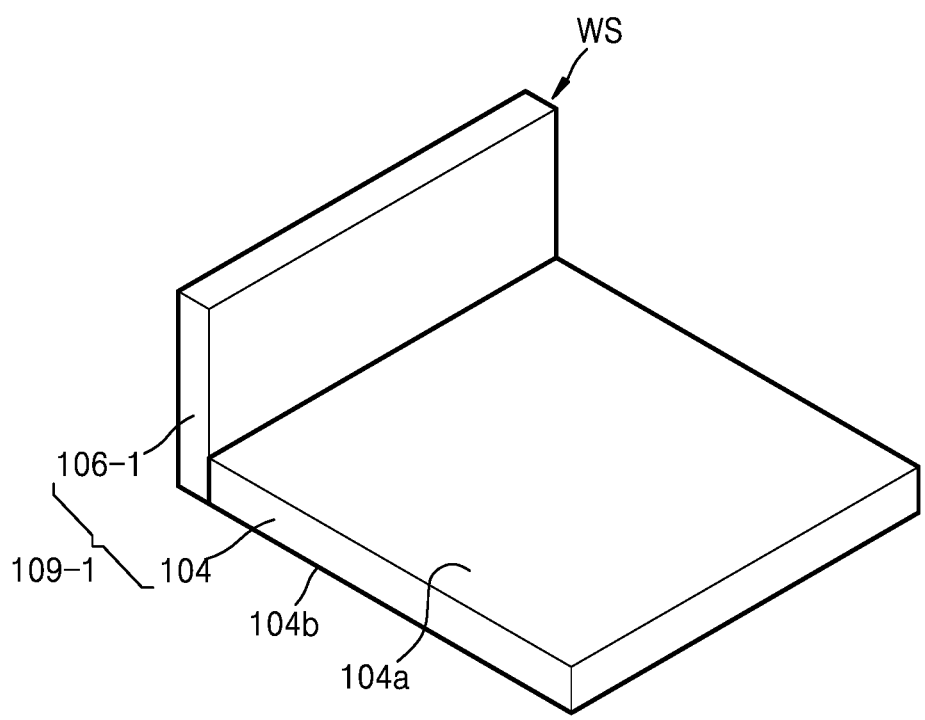
FIG. 11 is a perspective view of a shielding body of the magneto-resistive chip package of FIGS. 9 and 10.

FIG. 9 is a layout view of a magneto-resistive chip package 210 according to an embodiment of the inventive concept. FIG. 10 is a perspective view of the magneto-resistive chip package 210 according to an embodiment of the inventive concept. FIG. 11 is a perspective view of a shielding body 109-1 of the magneto-resistive chip package 210 of FIG. 10.

In detail, the magneto-resistive chip package 210 may be the same as the magneto-resistive chip package 200 of FIGS. 1-3 and FIGS. 4A and 4B except for the shielding body 109-1, which is included in a shielding structure 118-1. Redundant descriptions of the features that are the same as or similar to those described above will be omitted herein, for the sake of convenience.

In the magneto-resistive chip package 210, the shielding body 109-1 of the shielding structure 118-1 may be positioned on the circuit board 102. The shielding body 109-1 may include a shielding base part 104 positioned on the circuit board 102, and a shielding intermediate part 106-1 provided on one side of the shielding base part 104 and connected to the shielding base part 104. In contrast with the previous embodiment, the shielding intermediate part 106-1 may be comprised of a wall WS extending from one side of the shielding base part 104. In some embodiments, in contrast with the embodiment shown in FIG. 3, the shielding intermediate part 106-1 may be a single contiguous wall extending along one side of the shielding base part 104. For example, the shielding intermediate part 106-1 may be a single contiguous wall extending substantially entirely along one side of the shielding base part 104. In some embodiments, as shown in FIG. 10, a bottom surface 106-1a of the wall WS may contact an upper surface 104a of the shielding base part 104. In some embodiments, the wall WS may be formed integrally with the shielding base part 104, whereas in other embodiments, the wall WS may be a separate member contacting and extending from the upper surface 104a of the shielding base part 104.

In some embodiments, as shown in FIG. 11, the wall WS may extend from the upper surface 104a of one side of the shielding base part 104 to a bottom surface thereof.

The shielding structure 118-1 may be completed by forming the shielding cover 116 on the shielding intermediate part 106-1 comprised of the wall WS. Since the magneto-resistive chip package 210 shields the magneto-resistive cell array 110 by using the shielding structure 118-1 comprised of the shielding base part 104, the shielding intermediate part 106-1 formed of the wall WS, and the shielding cover 116, the shielding effect by the shield structure 118-1 may be increased more.

Figure 12:
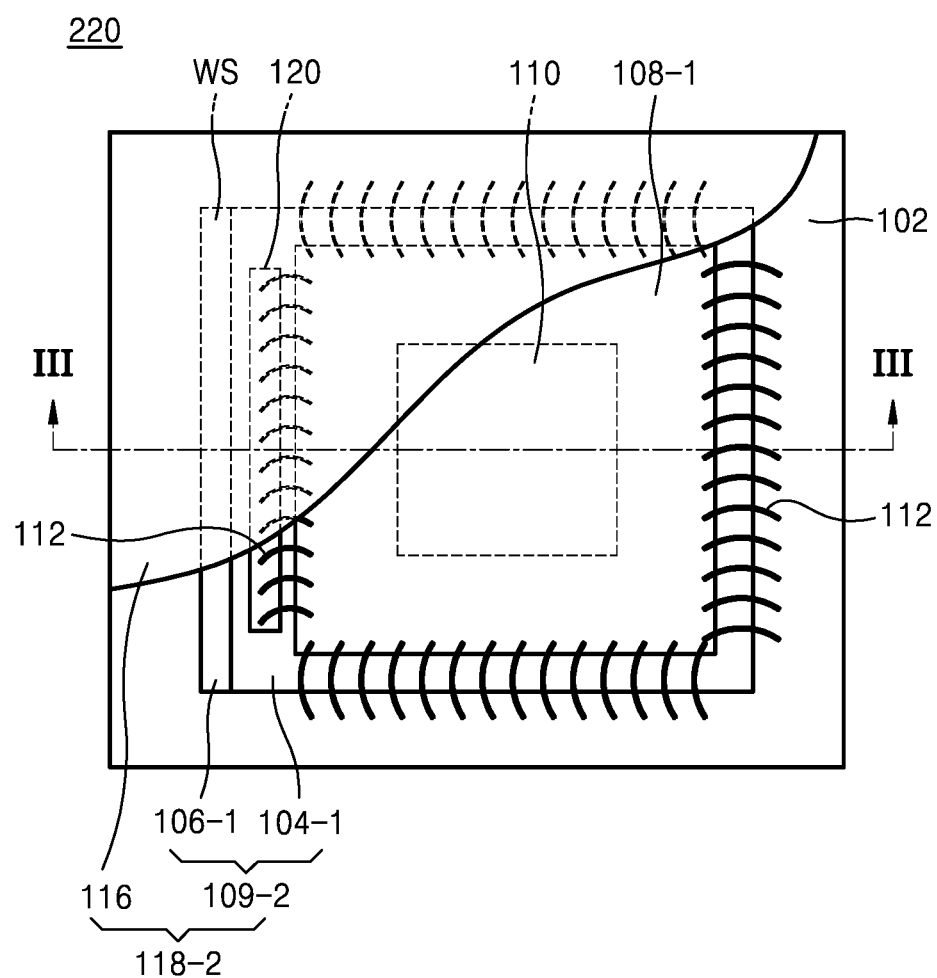
FIG. 12 is a layout view of a magneto-resistive chip package according to an embodiment of the inventive concept.
Figure 13:
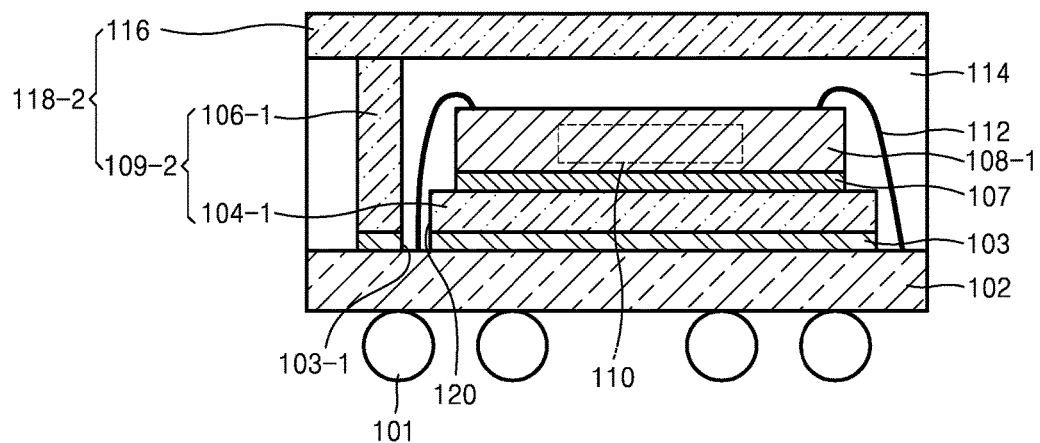
FIG. 13 is a cross-sectional view taken along line III-III in FIG. 12.
Figure 14:
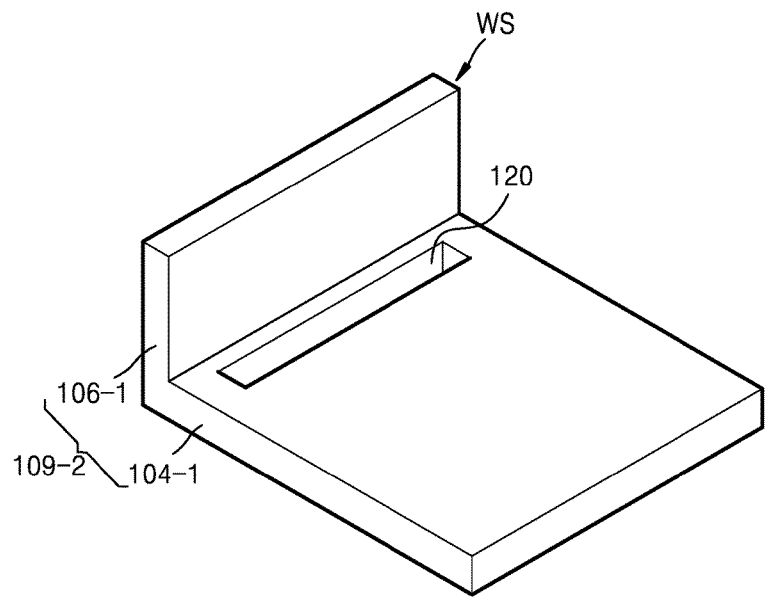
FIG. 14 is a perspective view of a shielding body of the magneto-resistive chip package of FIGS. 12 and 13.

FIG. 12 is a layout view of a magneto-resistive chip package 220 according to another embodiment of the inventive concept. FIG. 13 is a cross-sectional view taken along line III-III in FIG. 12. FIG. 14 is a perspective view of a shielding body 109-2 of the magneto-resistive chip package 220 of FIG. 13.

In detail, the magneto-resistive chip package 220 may be substantially the same as the magneto-resistive chip package 210 of FIGS. 9-11 except for the shielding body 109-2 that is included in a shielding structure 118-2. Descriptions of matters of FIGS. 12-14 that are the same as or similar to those described above will not be provided herein, for convenience of explanation.

In the magneto-resistive chip package 220, the shielding body 109-2 included in the shielding structure 118-2 may be positioned on the circuit board 102. The shielding body 109-2 may include a shielding base part 104-1 positioned on the circuit board 102, and a shielding intermediate part 106-1 provided on one side of the shielding base part 104-1 and connected to the shielding base part 104-1. In contrast with the previous embodiments, the shielding base part 104-1 of the shielding body 109-2 may include a penetration hole 120, through which the circuit board 102 is exposed. The penetration hole 120 may be positioned on one side of the shielding base part 104-1 adjacent to the shielding intermediate part 106-1. If the first adhesion layer 103 is formed on the circuit board 102, the penetration hole 120 may be in communication with an adhesion penetration hole 103-1 formed in the first adhesion layer 103.

A magneto-resistive chip 108-1 including a magneto-resistive cell array 110 may be positioned on the shielding body 109-2. Since the magneto-resistive chip 108-1 is positioned on the shielding base part 104-1 including the penetration hole 120, through which the circuit board 102 is exposed, the magneto-resistive chip 108-1 may be smaller than the magneto-resistive chip 108 according to the previous embodiments. The magneto-resistive chip package 220 may include an internal connection part 112 to electrically connect the magneto-resistive chip 108-1 to the circuit board 102 through the penetration hole 120. The internal connection part 112 may be bonding wires.

Similar to the previous embodiment, the shielding intermediate part 106-1 may be comprised of a wall WS extending from one side of the shielding base part 104-1. The shielding structure 118-2 may be completed by forming the shielding cover 116 on the shielding body 109-2 comprised of the shielding base part 104-1 including the through hole 120 and the shielding intermediate part 106-1 formed of the wall WS.

Since the magneto-resistive chip package 220 includes the penetration hole 120 within one side of the shielding base part 104-1, the magneto-resistive chip package 220 may easily electrically connect one edge of the magneto-resistive chip 108-1 to the circuit board 102 by using the internal connection part 112. Moreover, the magneto-resistive chip package 220 may electrically connect the remaining three edges of the magneto-resistive chip 108-1 directly to the circuit board 102 by using the internal connection part 112. As such, the magneto-resistive chip package 220 according to the present embodiment may have various types of internal connection parts 112 and thus increase the degree of freedom for package design.

Figure 15:
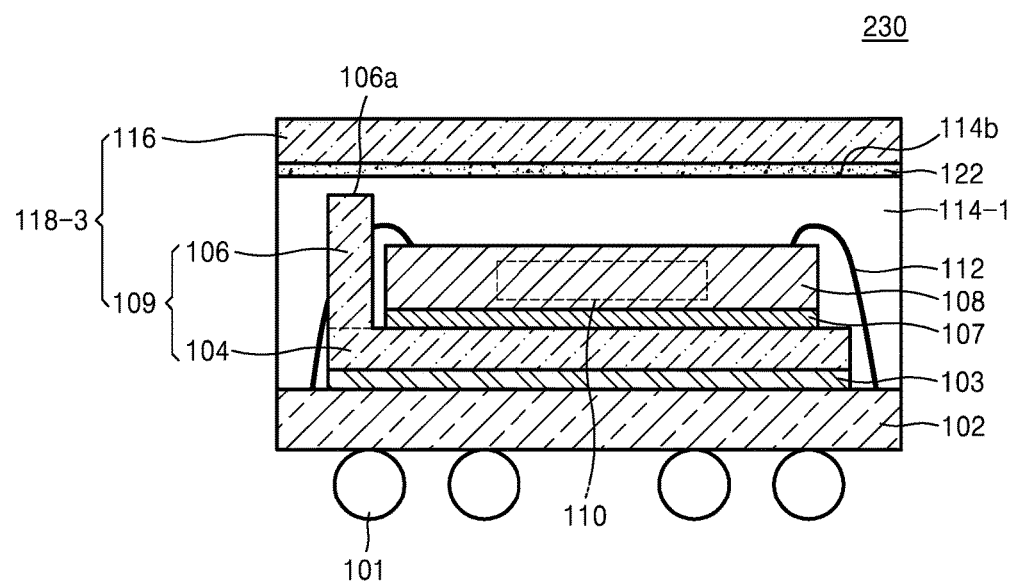
FIG. 15 is a cross-sectional view of a magneto-resistive chip package according to an embodiment of the inventive concept.

FIG. 15 is a cross-sectional view of a magneto-resistive chip package 230 according to an embodiment of the inventive concept.

In detail, the magneto-resistive chip package 230 may be the same as the magneto-resistive chip package 200 of FIGS. 1-3 except that an encapsulation part 114-1 is positioned to cover the shielding body 109 and a third adhesion layer 122 and a shielding cover 116 may be arranged on the encapsulation part 114-1. Redundant descriptions of the features (FIG. 15) that are the same as or similar to those described above will be omitted herein, for the sake of convenience.

The magneto-resistive chip package 230 may include an encapsulation part 114-1 having an upper surface 114b higher than the upper surface 106a of the shielding intermediate part 106 of the shielding body 109. The shielding intermediate part 106 of FIG. 15 may be comprised of a plurality of columns spaced apart from each other on one side of the shielding base part 104, as in the embodiment of FIGS. 1-3. The shielding intermediate part 106 of FIG. 15 may be comprised of a wall extending from one side of the shielding base part 104, as in the embodiments of FIGS. 9-11. The third adhesion layer 122 may be formed on the encapsulation part 114-1, and the shielding cover 116 may be positioned on the third adhesion layer 122. The third adhesion layer 122 may include a magnetic material.

As such, the magneto-resistive chip package 230 may include a shielding structure 118-3 in which the shielding intermediate part 106 does not contact the shielding cover 116. Even when the shielding structure 118-3 is formed such that the shielding intermediate part 106 included in the shielding body 109 does not contact the shielding cover 116, as described above, the shielding effect of the magneto-resistive cell array 110 may be obtained.

Figure 16:
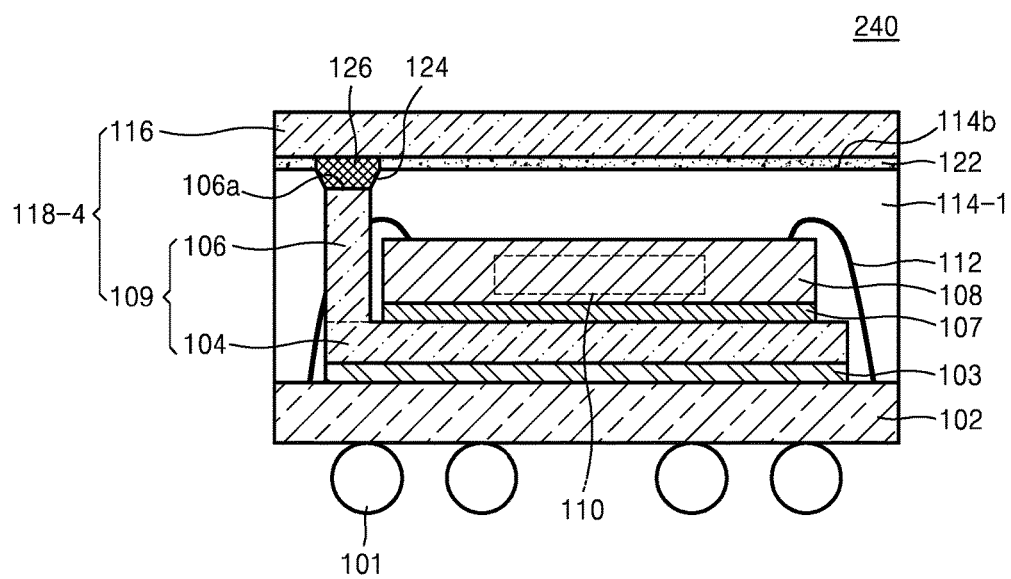
FIG. 16 is a cross-sectional view of a magneto-resistive chip package according to an embodiment of the inventive concept.

FIG. 16 is a cross-sectional view of a magneto-resistive chip package 240 according to an embodiment of the inventive concept.

In detail, the magneto-resistive chip package 240 may be the same as the magneto-resistive chip package 230 of FIG. 15 except that a fourth adhesion layer 126 is formed on the upper surface 106*a* of the shielding intermediate part 106 of the shielding body 109. Descriptions of matters of FIG. 16 that are the same as or similar to those described above will not be provided herein, for convenience of explanation.

Similar to the magneto-resistive chip package 230 of FIG. 15, the magneto-resistive chip package 240 may include an encapsulation part 114-1 having an upper surface 114*b* higher than the upper surface 106*a* of the shielding intermediate part 106. The shielding intermediate part 106 of FIG. 16 may be comprised of a plurality of columns spaced apart from each other on one side of the shielding base part 104, similar to the embodiments shown in FIGS. 1-3. The shielding intermediate part 106 of FIG. 16 may be comprised of a wall extending from one side of the shielding base part 104, similar to the embodiments of FIGS. 9-11.

A recess hole 124 recessed lower than the upper surface 114*b* of the encapsulation part 114-1 is formed over the shielding intermediate part 106. As will be described later, the recess hole 124 may be formed by drilling the encapsulation part 114-1 with laser or other suitable methods known to one skilled in the art.

The recess hole 124 may be filled with a fourth adhesion layer 126. The fourth adhesion layer 126 may include a magnetic material. A shielding structure 118-4 may be completed by placing the shielding cover 116 on the third adhesion layer 122 positioned on the encapsulation part 114-1 and the fourth adhesion layer 126 positioned on the shielding intermediate part 106.

As such, in the magneto-resistive chip package 240, the shielding intermediate part 106 may be connected with the shielding cover 116 through the fourth adhesion layer 126. Even when the shielding structure 118-4 is formed such that the shielding intermediate part 106 is connected with the shielding cover 116 through the fourth adhesion layer 126, as described above, the magneto-resistive cell array 110 may still be shielded from the external magnetic field.

Figure 17:
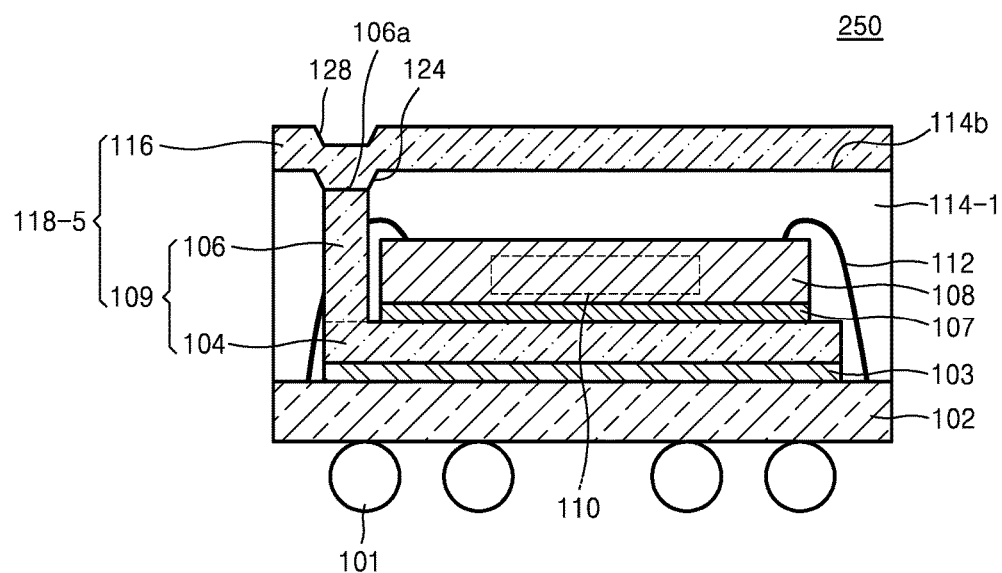
FIG. 17 is a cross-sectional view of a magneto-resistive chip package according to an embodiment of the inventive concept.

FIG. 17 is a cross-sectional view of a magneto-resistive chip package 250 according to some embodiments.

In detail, the magneto-resistive chip package 250 may be substantially the same as the magneto-resistive chip package 240 of FIG. 16 except that a shielding cover 116 is formed on the encapsulation part 114-1 while filling a recess hole 124 formed over the upper surface 106*a* of the shielding intermediate part 106 included in the shielding body 109. Descriptions of matters of FIG. 17 that are the same as or similar to those described above will not be provided herein, for convenience of explanation.

Similar to the magneto-resistive chip package 240 of FIG. 16, the magneto-resistive chip package 250 includes an encapsulation part 114-1 having an upper surface 114*b* higher than the upper surface 106*a* of the shielding intermediate part 106 included in the shielding body 109. The shielding intermediate part 106 of FIG. 17 may be comprised of a plurality of columns spaced apart from each other on one side of the shielding base part 104, similar to the embodiments of FIGS. 1-3. The shielding intermediate part 106 of FIG. 17 may be comprised of a wall extending from one side of the shielding base part 104, similar to the embodiments of FIGS. 9-11. The recess hole 124, which is recessed lower than the upper surface 114-*b* of the encapsulation part 114-1, may be formed over the shielding intermediate part 106.

A shielding structure 118-5 may be completed by placing the shielding cover 116 on the encapsulation part 114-1 while filling the recess hole 124. The shielding cover 116 may be formed by, for example, sputtering, as will be described later.

In some embodiments, the magneto-resistive chip package 250 may include the shielding structure 118-5 in which the shielding intermediate part 106 included in the shielding body 109 directly contacts the shielding cover 116. Since the shielding intermediate part 106 contacts the shielding cover 116, the magneto-resistive cell array 110 may be shielded from the external magnetic field.

Figure 18:
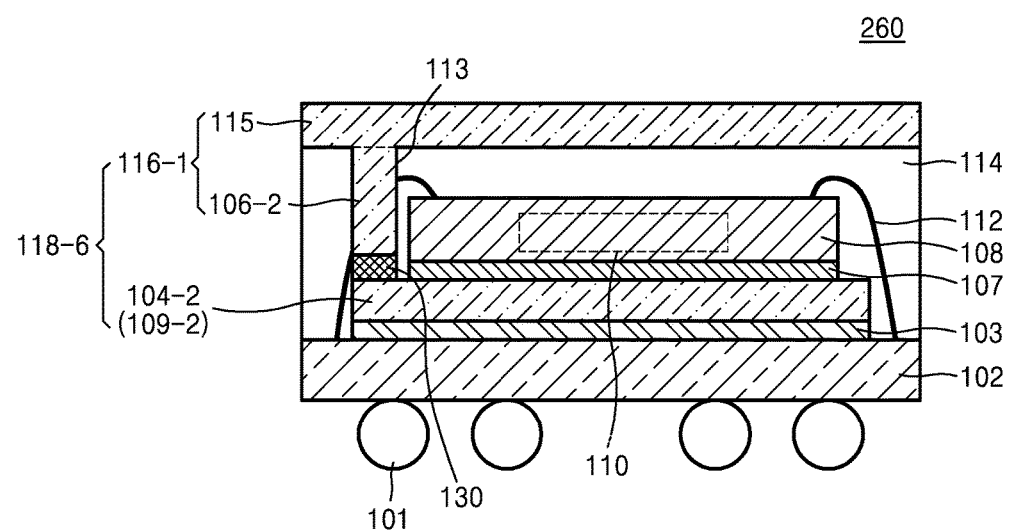
FIG. 18 is a cross-sectional view of a magneto-resistive chip package according to an embodiment of the inventive concept.

FIG. 18 is a cross-sectional view of a magneto-resistive chip package 260 according to some embodiments.

In detail, the magneto-resistive chip package 260 may be the same as the magneto-resistive chip package 200 of FIGS. 1-3 except for a shielding body 109-2 and a shielding cover 116-1. Descriptions of matters of FIG. 18 that are the same as or similar to those described above will not be provided herein, for convenience of explanation.

In the magneto-resistive chip package 260, the shielding body 109-2 may be positioned on the circuit board 102. The shielding body 109-2 may be a shielding base part 104-2 position under the magneto-resistive chip 108. The shielding body 109-2 may have a substantially straight-line shape. A shielding intermediate part 106-2 may extend toward the shielding body 109-2, within the encapsulation part 114. The shielding intermediate part 106-2 may be buried within an opening or aperture 113 formed in the encapsulation part 114. A line-shaped shielding part 115 connected to the shielding intermediate part 106-2 may be formed on the encapsulation part 114. The shielding intermediate part 106-2 may be integrally formed with the shielding part 115 to thereby constitute a T-shaped shielding cover 116-1. The T-shaped shielding cover 116-1 may be disposed on substantially the entire upper surface of the encapsulation part 114.

In some embodiments, a fifth adhesion layer 130 may be positioned on a lower surface of the shielding intermediate part 106-2 and an upper surface of the shielding body 109-2. The fifth adhesion layer 130 may include a magnetic material.

The shielding intermediate part 106-2 of FIG. 18 may comprise a plurality of columns spaced apart from each other, similar to the embodiments of FIGS. 1-3. The shielding intermediate part 106-2 of FIG. 18 may be comprised of a wall extending from an upper surface of the shielding base part 104-2, similar to the embodiments of FIGS. 9-11. As such, the magneto-resistive chip package 260 may include a shielding structure 118-6 in which the shielding body 109-2 contacts or does not contact the shielding cover 116-1. The shielding structure 118-6 may shield the magneto-resistive cell array 110 of the magneto-resistive chip 108 positioned on the circuit board 102 from the external magnetic field.

FIGS. 19A-19E are cross-sectional views for explaining a method of manufacturing a magneto-resistive chip package according to some embodiments of the inventive concept.

In detail, FIGS. 19A-19E schematically illustrate a process of manufacturing the magneto-resistive chip package 200 of FIGS. 1-3.

Figure 19A:
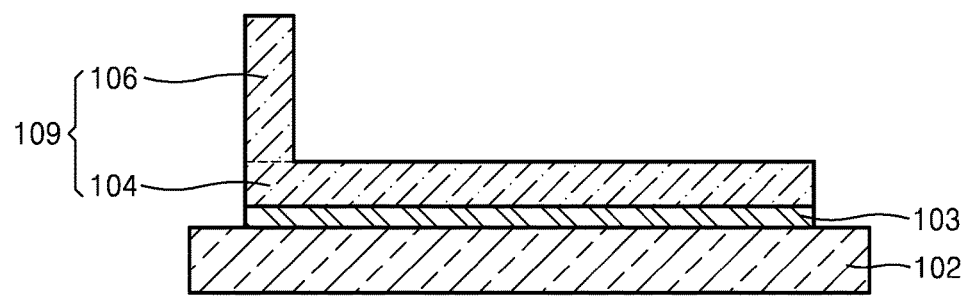
FIGS. 19A-19E are cross-sectional views for explaining a method of manufacturing a magneto-resistive chip package according to an embodiment of the inventive concept.

Referring to FIG. 19A, an L-shaped shielding body 109 may be positioned on a circuit board 102 with a first adhesion layer 103 interposed therebetween. The L-shaped shielding body 109 may include a shielding base part 104 positioned on the circuit board 102, and a shielding intermediate part 106 provided on one side of the shielding base part 104 and connected to the shielding base part 104.

Figure 19B:
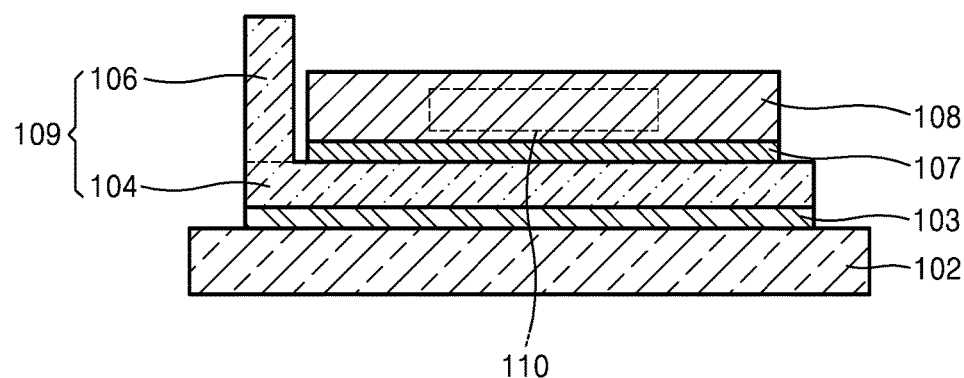

Then, referring to FIG. 19B, a second adhesion layer 107 may be positioned on the shielding base part 104 included in the L-shaped shielding body 109, and a magneto-resistive chip 108 including a magneto-resistive cell array 110 is positioned on the second adhesion layer 107. The magneto-resistive cell array 110 may occupy only a portion, for example, a central region, of the magneto-resistive chip 108.

Figure 19C:
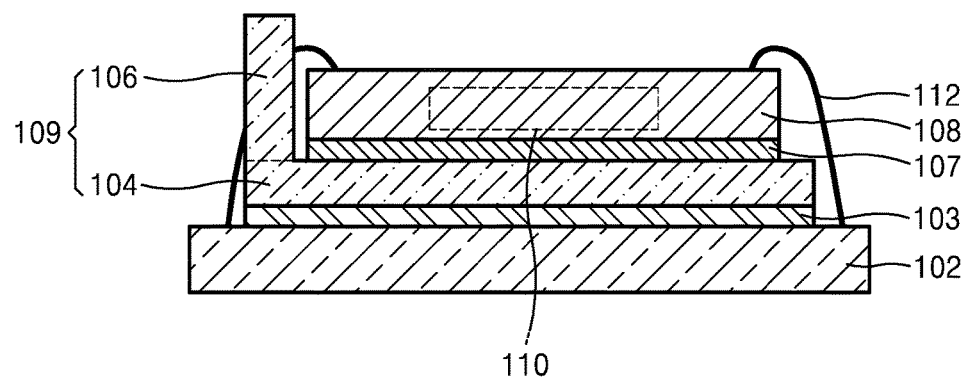

Referring to FIG. 19C, the magneto-resistive chip 108 and the circuit board 102 are electrically connected to each other via the internal connection part 112. The internal connection part 112 may be bonding wires. Also, as illustrated in FIG. 3, the plurality of columns COL define an opening (or a gap) 109g therebetween such that the internal connection part 112 can pass through the opening to electrically connect the magneto-resistive chip 108 with the circuit board 102.

Figure 19D:
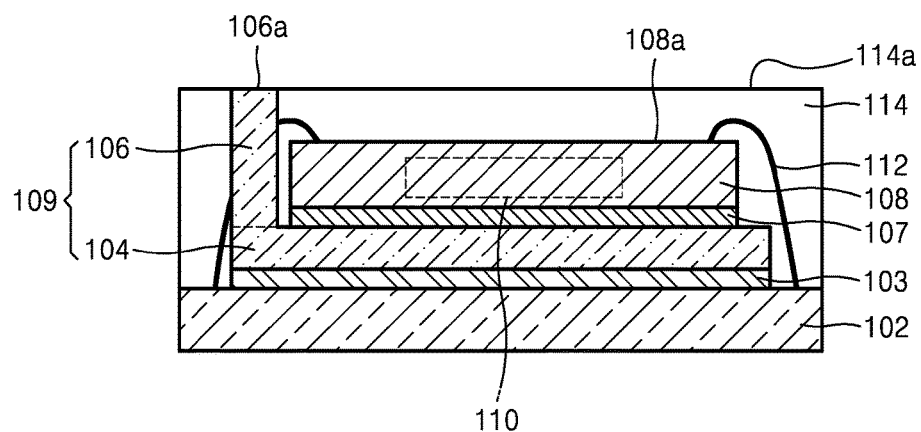

Then, referring to FIG. 19D, an encapsulation part 114 for encapsulating the magneto-resistive chip 108 may be formed on the circuit board 102. The encapsulation part 114 may be formed to have an upper surface 114a higher than an upper surface 108a of the magneto-resistive chip 108. The encapsulation part 114 may be formed to expose an upper surface 106a of the shielding intermediate part 106. Accordingly, the upper surface 114a of the encapsulation part 114 may be at substantially the same level as the upper surface 106a of the shielding intermediate part 106.

Figure 19E:
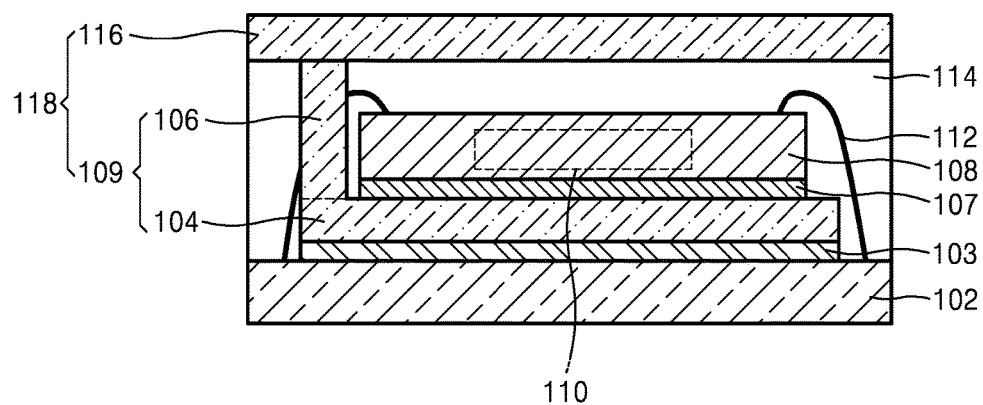

Referring to FIG. 19E, a shielding cover 116 may be positioned on the shielding intermediate part 106 and the encapsulation part 114. The shielding cover 116 may be position on the magneto-resistive cell array 110 while contacting the upper surface 106a of the shielding intermediate part 106 and the upper surface 114a of the encapsulation part 114. In this way, the magneto-resistive chip package 200 including a shielding structure 118 comprised of the shielding base part 104, the shielding intermediate part 106, and the shielding cover 116 can be manufactured.

Figure 20A:
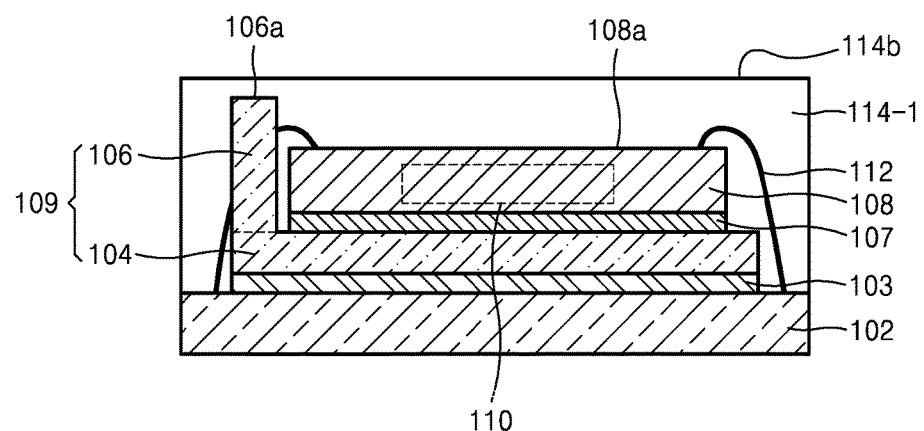
FIGS. 20A and 20B are cross-sectional views for explaining a method of manufacturing a magneto-resistive chip package according to an embodiment of the inventive concept.
Figure 20B:
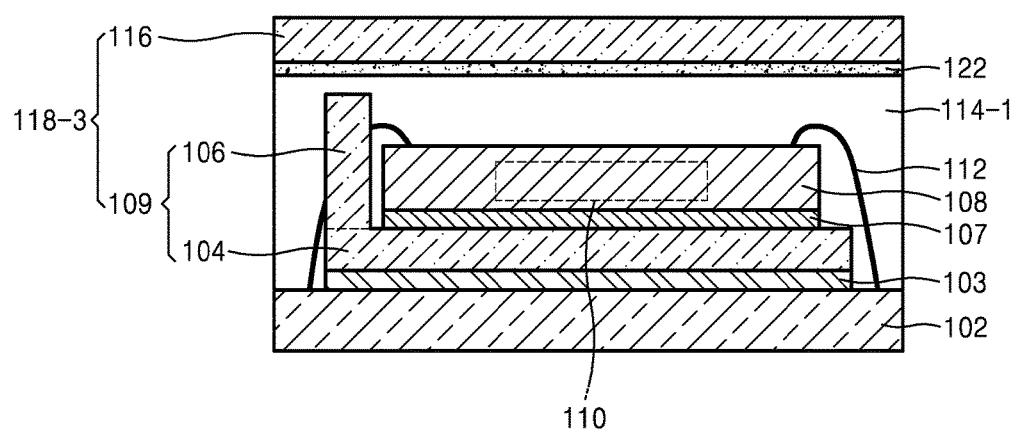

FIGS. 20A and 20B are cross-sectional views for explaining a method of manufacturing a magneto-resistive chip package according to some embodiments.

In detail, FIGS. 20A and 20B schematically illustrate a process of manufacturing the magneto-resistive chip package 230 of FIG. 15. As described above with reference to FIGS. 19A-19C, an L-shaped shielding body 109 is positioned on a circuit board 102 with a first adhesion layer 103 interposed therebetween. A second adhesion layer 107 is positioned on the shielding base part 104 of the L-shaped shielding body 109, and a magneto-resistive chip 108 including a magneto-resistive cell array 110 is positioned on the second adhesion layer 107. The magneto-resistive chip 108 and the circuit board 102 may be electrically connected to each other through an internal connection part 112.

Referring to FIG. 20A, an encapsulation part 114-1 for encapsulating the magneto-resistive chip 108 may be formed on the circuit board 102. The encapsulation part 114-1 may be formed to have an upper surface 114b higher than an upper surface 108a of the magneto-resistive chip 108. The encapsulation part 114-1 may be formed to have a sufficient thickness enough to cover an upper surface 106a of the shielding intermediate part 106.

Referring to FIG. 20B, a third adhesion layer 122 including a magnetic material may be formed on the encapsulation part 114-1. Then, the shielding cover 116 may be positioned on the third adhesion layer 122. In this way, the magneto-resistive chip package 230 including a shielding structure 118-3 comprised of the shielding base part 104, the shielding intermediate part 106, and the shielding cover 116 can be manufactured.

Figure 21A:
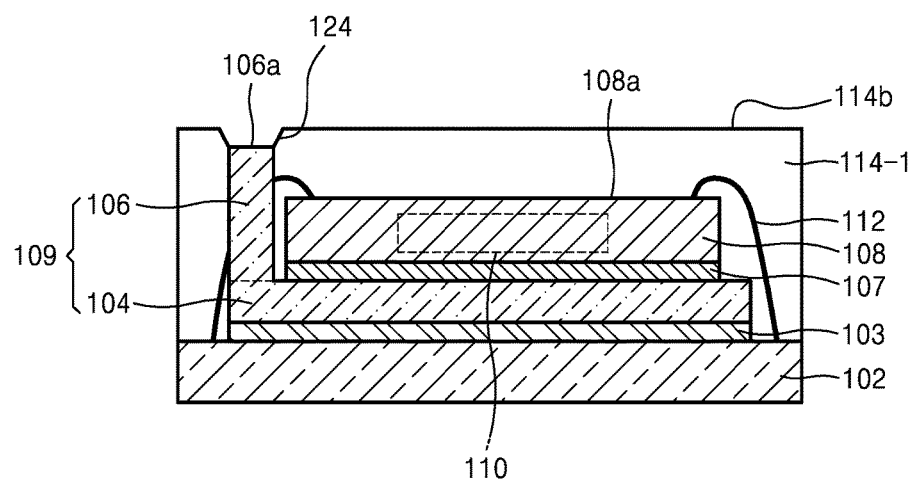
FIGS. 21A-21C are cross-sectional views for explaining a method of manufacturing a magneto-resistive chip package according to an embodiment of the inventive concept.
Figure 21B:
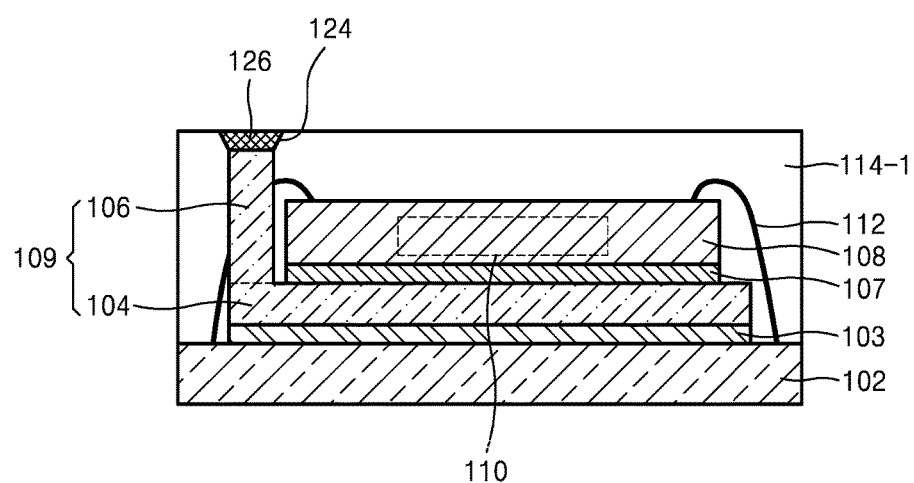
Figure 21C:
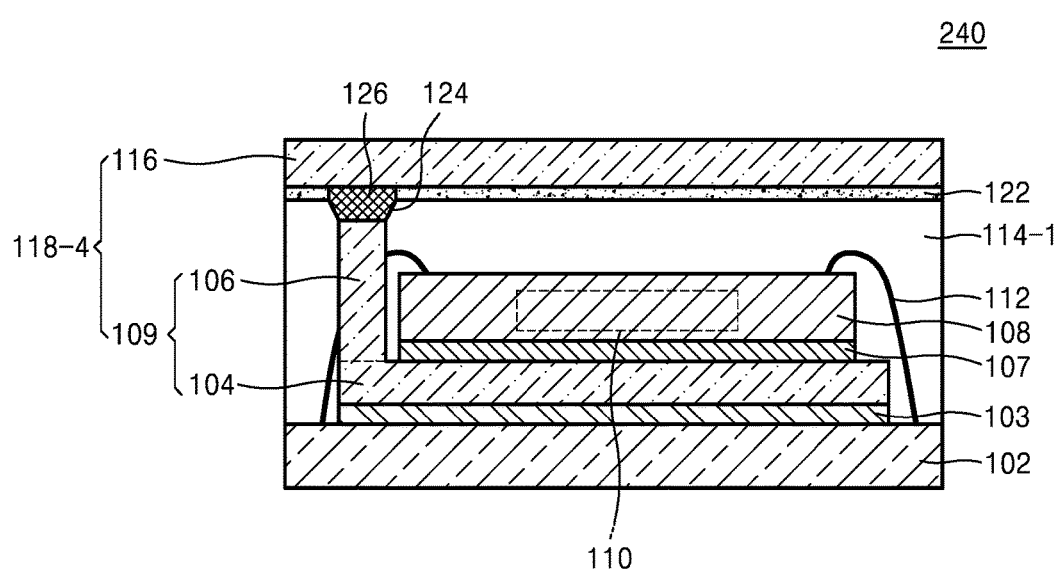

FIGS. 21A-21C are cross-sectional views for explaining a method of manufacturing a magneto-resistive chip package according to some embodiments.

In detail, FIGS. 21A-21C schematically illustrate a process of manufacturing the magneto-resistive chip package 240 of FIG. 16. As described above with reference to FIGS. 19A-19C, an L-shaped shielding body 109 may be positioned on a circuit board 102 with a first adhesion layer 103 interposed therebetween. A second adhesion layer 107 may be positioned on a shielding base part 104 of the L-shaped shielding body 109, and a magneto-resistive chip 108 including a magneto-resistive cell array 110 may be positioned on the second adhesion layer 107. The magneto-resistive chip 108 and the circuit board 102 may be electrically connected to each other through an internal connection part 112.

As described above with reference to FIG. 20A, an encapsulation part 114-1 for encapsulating the magneto-resistive chip 108 may be formed on the circuit board 102. The encapsulation part 114-1 may be formed to have a sufficient thickness enough to cover an upper surface 106a of the shielding intermediate part 106.

Referring to FIG. 21A, a recess hole 124 recessed lower than an upper surface 114a of the encapsulation part 114-1 may be formed over a shielding intermediate part 106. The recess hole 124 may be formed by, for example, drilling the encapsulation part 114-1 with laser. The recess hole 124 may be formed to have a large upper diameter and a small lower diameter. Referring to FIG. 21B, the recess hole 124 may be filled with a fourth adhesion layer 126 including a magnetic material. An upper surface of the fourth adhesion layer 126 may be at substantially the same level as an upper surface 114b of the encapsulation part 114-1.

Referring to FIG. 21C, a shielding structure 118-4 may be completed by placing a shielding cover 116 on the third adhesion layer 122 positioned on the encapsulation part 114-1 and the fourth adhesion layer 126 positioned on the shielding intermediate part 106. In this way, the magneto-resistive chip package 240 including a shielding structure 118-4 comprised of the shielding base part 104, the shielding intermediate part 106, and the shielding cover 116 can be manufactured.

Figure 22:
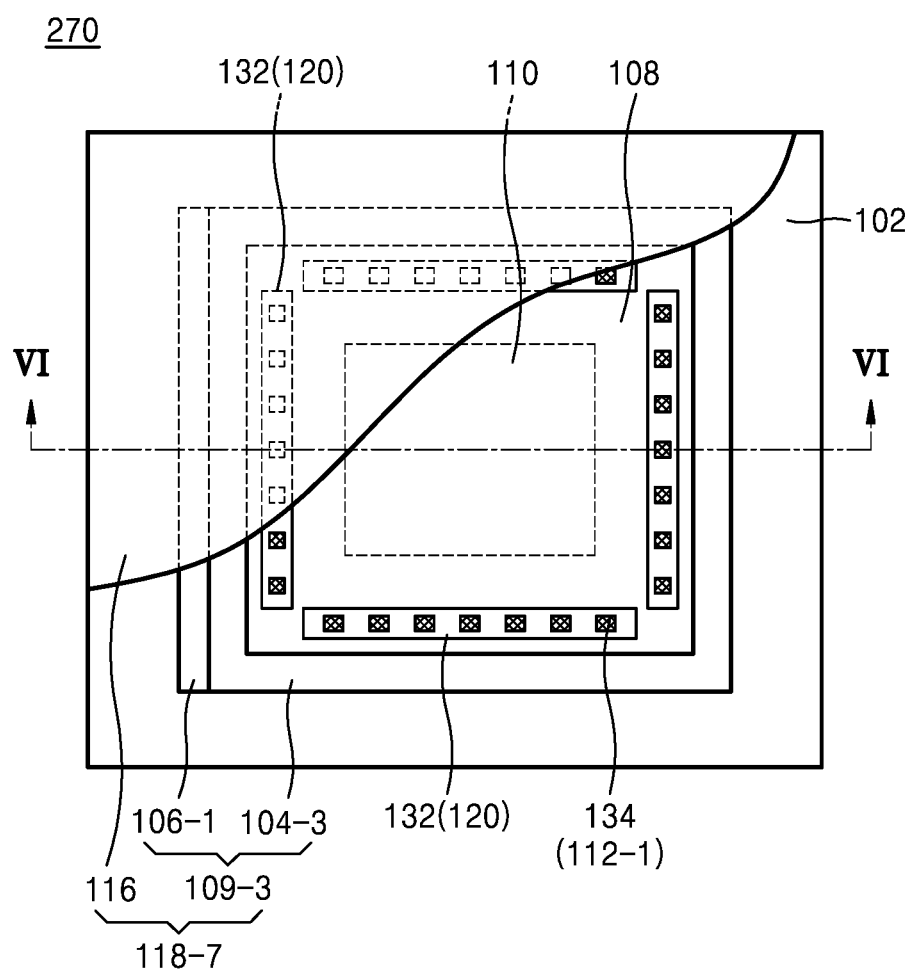
FIG. 22 is a layout view of a magneto-resistive chip package according to an embodiment of the inventive concept.
Figure 23:
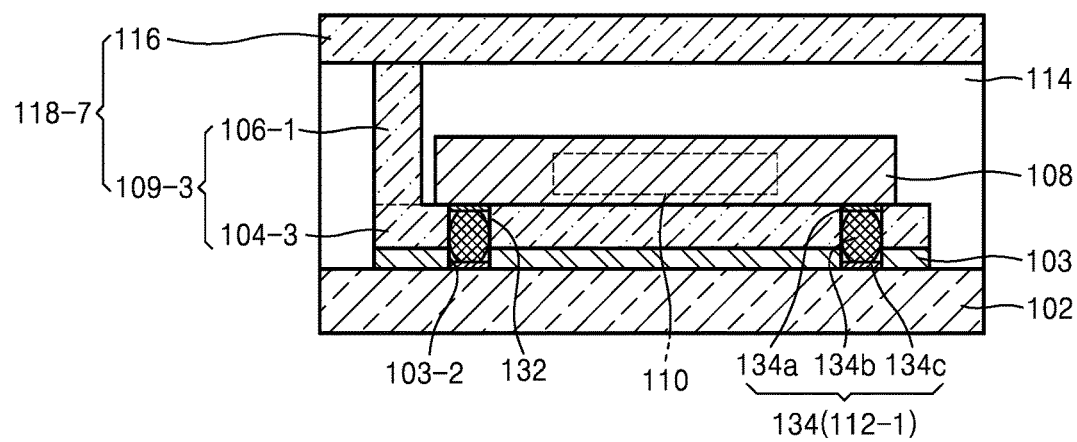
FIG. 23 is a cross-sectional view taken along line VI-VI in FIG. 22.
Figure 24:
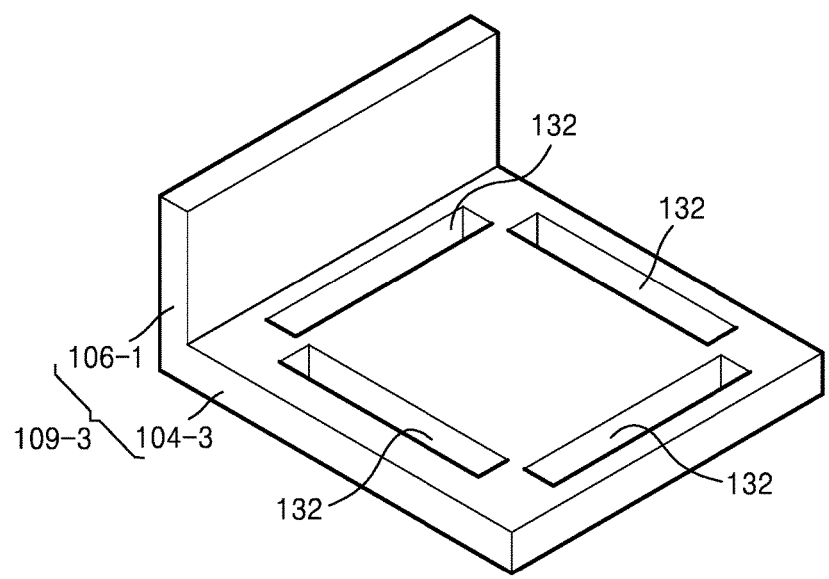
FIG. 24 is a perspective view of a shielding body of the magneto-resistive chip package of FIGS. 22 and 23.

FIG. 22 is a layout view of a magneto-resistive chip package 270 according to an embodiment of the inventive concept. FIG. 23 is a cross-sectional view taken along line VI-VI in FIG. 22. FIG. 24 is a perspective view of a shielding body 109-3 of the magneto-resistive chip package 270 of FIGS. 22 and 23.

In detail, the magneto-resistive chip package 270 may be substantially the same as the magneto-resistive chip package 220 of FIGS. 12-14 except for the shielding body 109-3 of a shielding structure 118-7, and an internal connection part 112-1. Descriptions of matters of FIGS. 22-24 that are the same as or similar to those described above will not be provided herein, for convenience of explanation.

In the magneto-resistive chip package 270, the shielding body 109-3 of the shielding structure 118-7 may be positioned on a circuit board 102. The shielding body 109-3 may include a shielding base part 104-3 positioned on the circuit board 102, and a shielding intermediate part 106-1 provided on one side of the shielding base part 104-3 and connected to the shielding base part 104-3.

In contrast with the previous embodiments, the shielding base part 104-3 of the shielding body 109-3 may include a plurality of penetration holes 132, through which the circuit board 102 may be exposed. The penetration holes 132 may be positioned around four edges or a periphery of the shielding base part 104-3. In some embodiments, the penetration holes 132 may not be formed around all four edges of the shielding base part 104-1. Depending on the application, the penetrations holes 132 may be formed on two or three edges of the shielding base part 104-1. A penetration hole 132 formed on an edge of the shielding base part 104-3 adjacent to the shielding intermediate part 106-1 may correspond to the penetration hole 120 of FIGS. 12 and 13. When a first adhesion layer 103 is formed on the circuit board 102, the penetration holes 132 may be in communication with adhesion penetration holes 103-2 formed in the first adhesion layer 103.

A magneto-resistive chip 108 including a magneto-resistive cell array 110 may be positioned on the shielding body 109-3. In contrast with the previous embodiments, the magneto-resistive chip 108 may be positioned on the shielding body 109-3 regardless of sizes thereof. The magneto-resistive chip package 270 may include an internal connection part 112-1 to electrically connect the magneto-resistive chip 108 to the circuit board 102 through the penetration hole 120. The internal connection part 112-1 may be a contact electrode 134. In detail, the contact electrode 134 may include a first pad 134a and a second pad 134c, which maybe formed of solder, and a through electrode 134b positioned between the first pad 134a and the second pad 134c. Similar to the previous embodiments, the shielding intermediate part 106-1 may be comprised of a wall WS extending from one side of the shielding base part 104-3. The shielding structure 118-7 may be completed by forming a shielding cover 116 on the shielding body 109-3 comprised of the shielding base part 104-3 including the penetration hole 120 and the shielding intermediate part 106-1 formed of the wall WS.

Since the magneto-resistive chip package 270 includes the penetration holes 120 in the shielding base part 104-3, the magneto-resistive chip 108 and the circuit board 102 may be electrically connected to each other through the internal connection part 112-1, which is the contact electrode 134.

Figure 25:
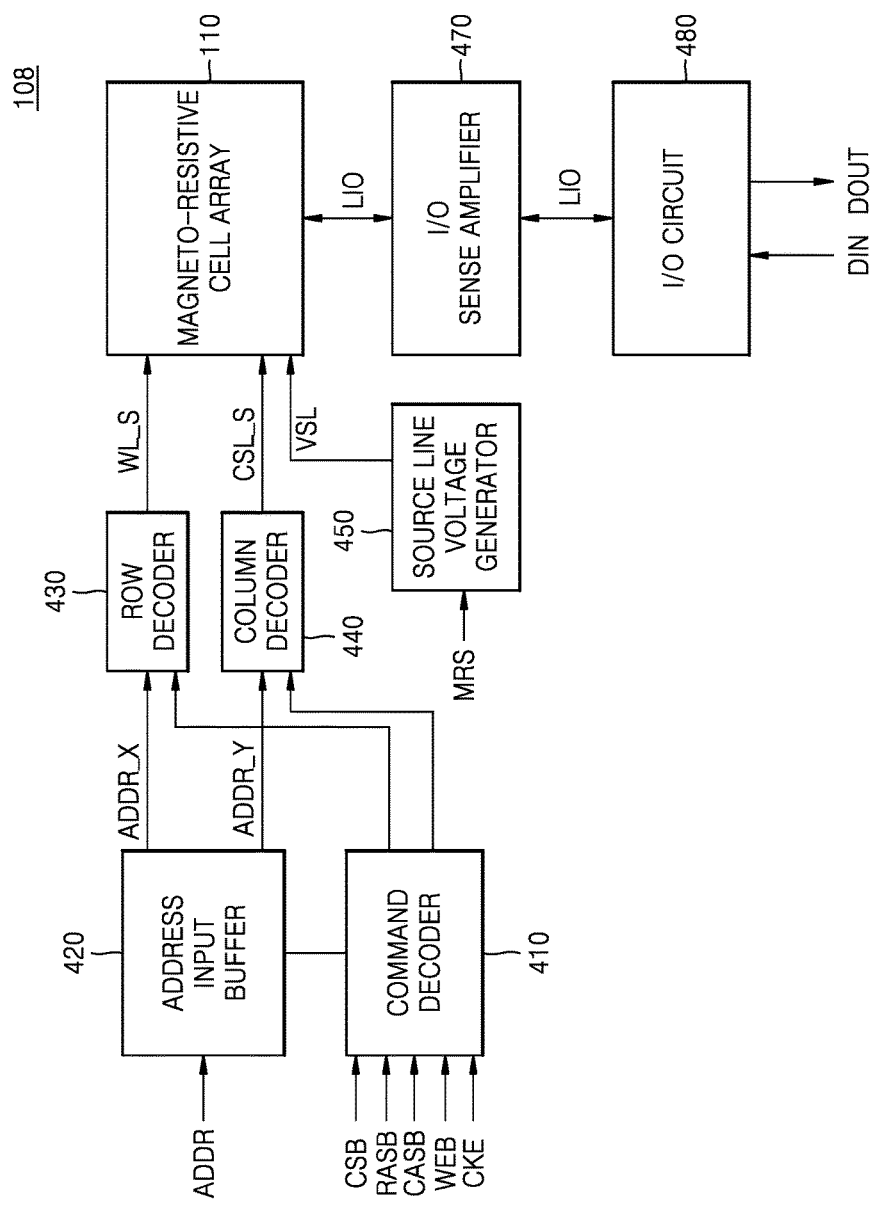
FIG. 25 is a block diagram of a magneto-resistive chip included in a magneto-resistive chip package according to an embodiment of the inventive concept.

FIG. 25 is a block diagram of a magneto-resistive chip 108 included in a magneto-resistive chip package according to an embodiment of the inventive concept.

In detail, the magneto-resistive chip 108 may include a command decoder 410, an address input buffer 420, a row decoder 430, a column decoder 440, a source line voltage generator 450, a magneto-resistive cell array 110, an input/output (I/O) sense amplifier 470, and an I/O circuit 480.

The command decoder 410 may generate a plurality of control signals by decoding a chip selection signal CSB, a row address strobe signal RASB, a column address strobe signal CASB, a write enable signal WEB, and a clock enable signal CKE, and may control circuit blocks included in the magneto-resistive chip 108. The magneto-resistive cell array 110 includes a plurality of magneto-resistive cells, for example, a plurality of STT-MRAM cells, and operates in response to a word line driving signal WL_S and a column selection signal CSL_S.

The address input buffer 420 generates a row address ADDR_X and a column address ADDR_Y, based on an external address ADDR. The row decoder 430 generates a decoded row address by decoding the row address ADDR_X, and generates the word line driving signal WL_S based on the decoded row address. The column decoder 440 generates a decoded column address by decoding the column address ADDR_Y, and generates the column selection signal CSL_S based on the decoded column address.

The source line voltage generator 450 generates a source line driving voltage VSL based on an external power supply voltage and provides the source line driving voltage VSL to source lines of the magneto-resistive cell array 110. The source line voltage generator 450 may deactivate all or some of the circuit blocks included in the source line voltage generator 450, in a stand-by mode or a power-down mode. The source line voltage generator 450 may also deactivate all or some of the circuit blocks included in the source line voltage generator 450, in response to a mode register set signal MRS.

The I/O sense amplifier 470 outputs first data by amplifying data that is output by the magneto-resistive cell array 110 via a local I/O line LIO, and transmits received input data DIN to the magneto-resistive cell array 110 via the local I/O line LIO. The I/O circuit 480 generates output data DOUT by determining an order of outputting the first data and performing parallel-serial conversion, and buffers the input data DIN and provides buffered input data DIN to the I/O sense amplifier 470.

Figure 26:
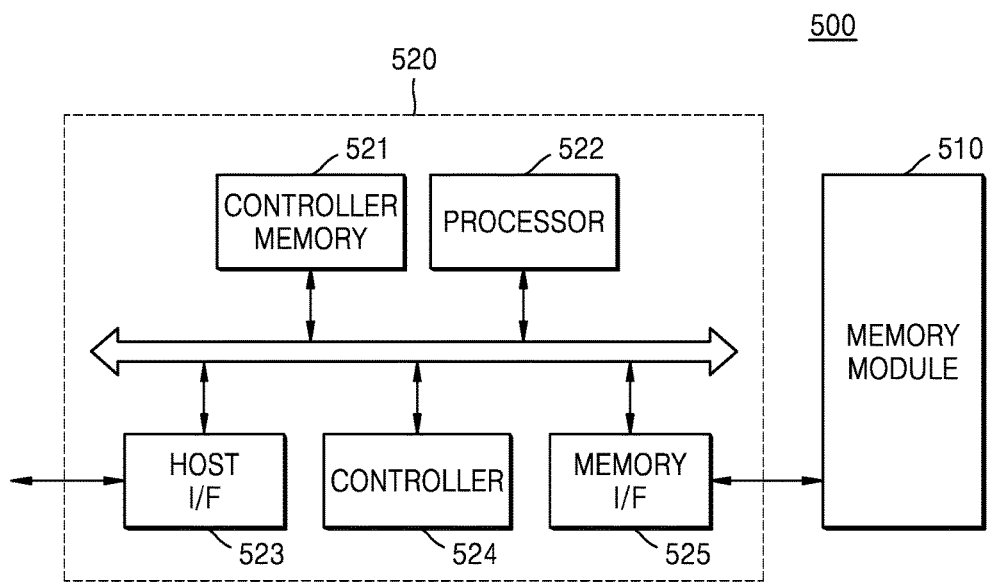
FIG. 26 is a block diagram of a memory card including a magneto-resistive chip package according to an embodiment of the inventive concept.

FIG. 26 is a block diagram of a memory card 500 including a magneto-resistive chip package according to an embodiment of the inventive concept.

In detail, the memory card 500 may include a memory controller 520 that generates a command signal and an address signal, and a memory module 510, for example, a flash memory including one flash memory device or a plurality of flash memory devices. The memory controller 520 includes a host interface (I/F) 523 that transmits or receives the command signal and the address signal to or from a host, and a memory I/F 525 that transmits or receives the command signal and the address signal to or from the memory module 510. The host I/F 523, a controller 524, and the memory I/F 525 communicate with a controller memory 521, such as a static random access memory (SRAM), and a processor 522, such as a central processing unit (CPU), through a common bus.

The memory module 510 receives the command signal and the address signal from the memory controller 520, stores data in at least one of the memory devices of the memory module 510 in response to the command signal and the address signal, and retrieves data from at least one of the memory devices. Each memory device includes a plurality of addressable memory cells and a decoder that generates column signals and row signals to access at least one of the plurality of addressable memory cells during program and read operations.

Each of the components included in the memory card 500 including the memory controller 520, namely, the memory module 510 and the electronic devices 521, 522, 523, 524, and 525 included in the memory controller 520, may include a magneto-resistive chip package according to embodiments of the inventive concept.

Figure 27:
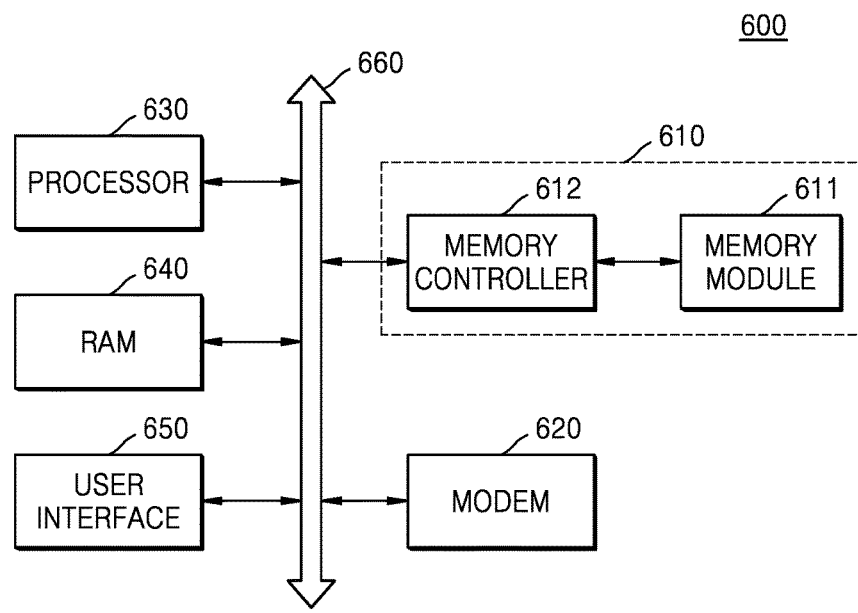
FIG. 27 is a block diagram of a memory system including a magneto-resistive chip package according to an embodiment of the inventive concept.

FIG. 27 is a block diagram of a memory system 600 including a magneto-resistive chip package according to an embodiment of the inventive concept.

In detail, the memory system 600 may include a processor 630, such as a CPU, a RAM 640, a user interface 650, and a modem 620 that communicate with each other through a common bus 660. Each of the components transmits a signal to the memory card 610 and receives a signal from the memory card 610 through the common bus 660. The memory card 610 may include a memory controller 612, and a memory module 611, for example, one flash memory or a plurality of flash memories.

Each of the memory card 610, the processor 630, the RAM 640, the user interface 650, and the modem 620 included in the memory system 600 may include a magneto-resistive chip package according to embodiments of the inventive concept.

The memory system 600 may be applicable to various electronic application fields. For example, the memory system 600 may be applicable to solid state drives (SSDs), CMOS image sensors (CISs), and a computer application chipset.

Figure 28:
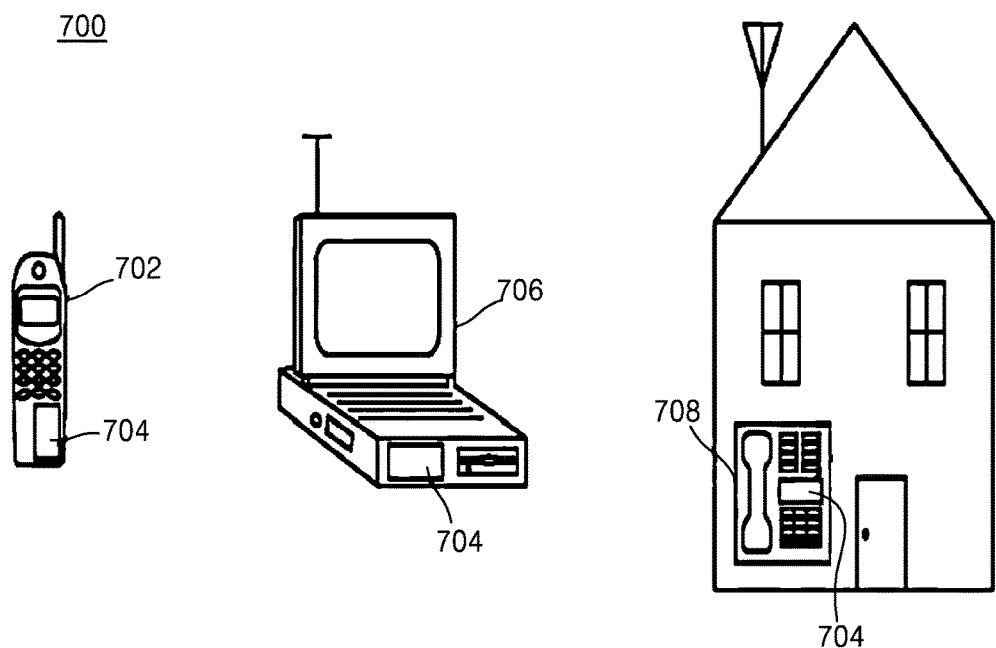
FIG. 28 illustrates various electronic apparatuses each including a magneto-resistive chip package according to embodiments of the inventive concept.

FIG. 28 illustrates various electronic apparatuses each including a magneto-resistive chip package according to embodiments of the inventive concept.

In detail, an electronic apparatus 700 may include a mobile telephone 702, a laptop computer 706, and a fixed terminal 708. An integrated circuit (IC) 704 including the magneto-resistive chip package according to embodiments of the inventive concept may be provided in each of the mobile telephone 702, the laptop computer 706, and the fixed terminal 708.

The mobile telephone 702, the laptop computer 706, and the fixed terminal 708 are examples of an electronic apparatus 700, and embodiments of the inventive concept are not limited thereto. Examples of the electronic apparatus 700 may include a smartphone, a tablet PC, a navigation device, a music player, and a video player.

Having described and illustrated embodiments of the inventive concepts with reference to the examples given above, it will be recognized that the technology is not so limited. For example, while the shielding intermediate part of the various embodiments described above (e.g., the shielding intermediate part 106, 106-1, 106-2, etc.) has been described as being integrally formed with either the shielding base part or the shielding cover, it will be appreciated that a magneto-resistive chip package may be provided with at least one shielding intermediate part that is integrally formed with the shielding base part and at least one shielding intermediate part that is integrally formed with the shielding cover. In such embodiments, a shielding intermediate part that is integrally formed with the shielding base part may contact a shielding intermediate part that is integrally formed with the shielding cover.

Figure 29:
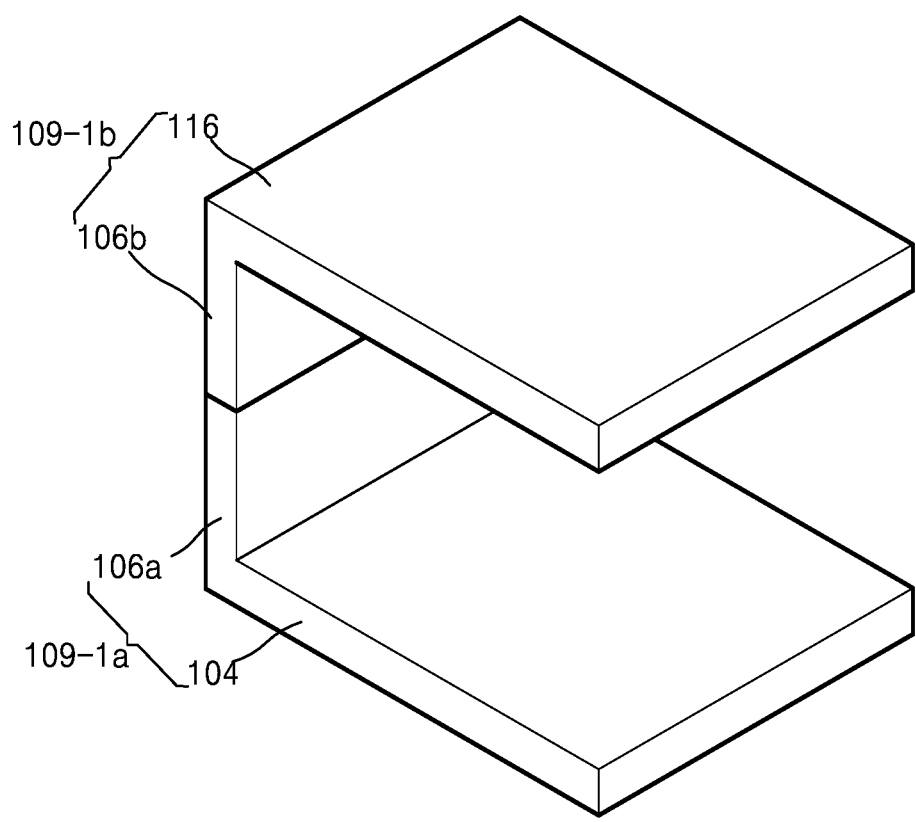
FIGS. 29 and 30 are perspective views of shielding bodies of the magneto-resistive chip packages according to some embodiments.

For example, and with reference to FIG. 29, a magneto-resistive chip package may be provided as exemplarily described in any of the embodiments above, but may include at least one shielding intermediate part 106a that is integrally formed with the shielding base part 104 and at least one shielding intermediate part 106b that is integrally formed with the shielding cover 116 and that contacts the shielding intermediate part 106a at an interface extending parallel to the shielding base part 104 and the shielding cover 116 (e.g., extending horizontally between the shielding base part 104 and the shielding cover 116). Such a magneto-resistive chip package may thus include, among other features, a first shielding body 109-1a comprised of the shielding base part 104 and the at least one shielding intermediate part 106a, and a second shielding body 109-1b comprised of the shielding cover 116 and the at least one shielding intermediate part 106b.

Figure 30:
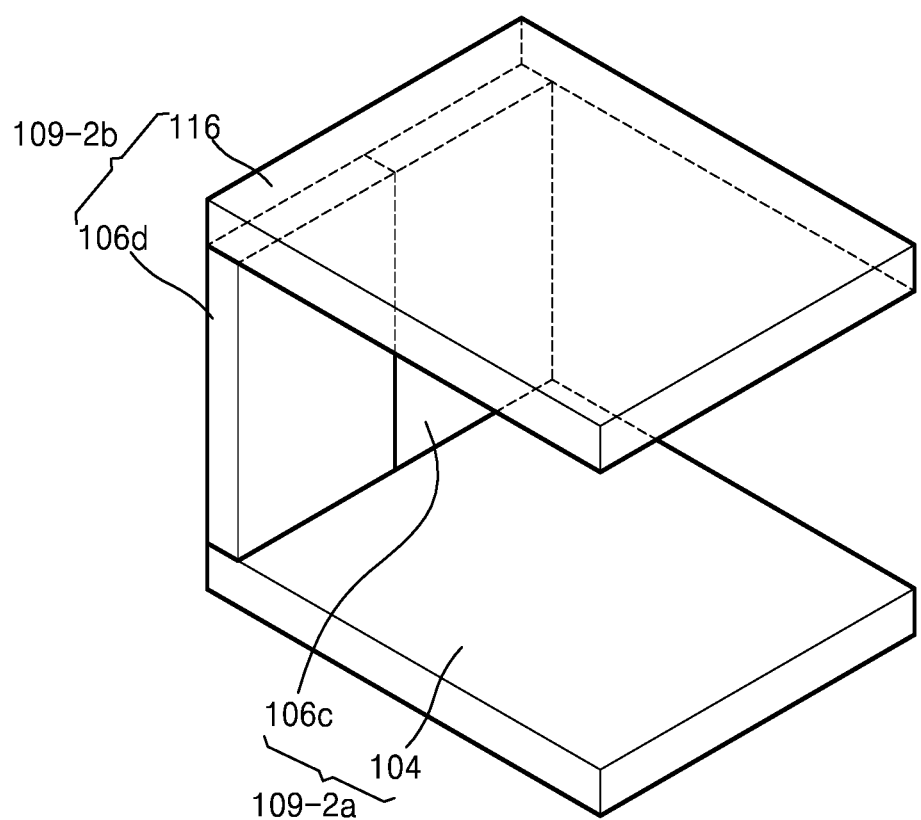

In another embodiment, and with reference to FIG. 30, a magneto-resistive chip package may be provided as exemplarily described in any of the embodiments above, but may include at least one shielding intermediate part 106c that is integrally formed with the shielding base part 104 and at least one shielding intermediate part 106d that is integrally formed with the shielding cover 116 and that contacts the shielding intermediate part 106c at an interface extending perpendicularly between the shielding base part 104 and the shielding cover 116 (e.g., extending vertically between the shielding base part 104 and the shielding cover 116). Such a magneto-resistive chip package may thus include, among other features, a first shielding body 109-2a comprised of the shielding base part 104 and the at least one shielding intermediate part 106c, and a second shielding body 109-2b comprised of the shielding cover 116 and the at least one shielding intermediate part 106d.

Figure 31:
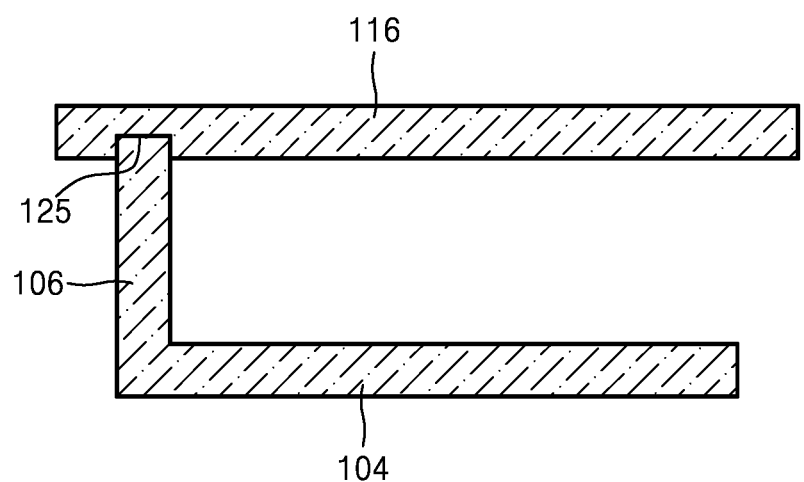
FIG. 31 is a cross-sectional view of a shielding body according to some embodiments.

In another example, while the shielding cover 116-1 has been described above as including an opening or aperture 113, which is configured to receive the shielding intermediate part 106-2, it will be appreciated that a shielding cover can be configured in any suitable manner to receive any portion of the shielding intermediate part. For example, and with reference to FIG. 31, the shielding cover 116 of any of the embodiments discussed above may include a recess (e.g., recess 125) arranged and configured to receive a peripheral portion of any shielding intermediate part (e.g., shielding intermediate part 116, etc.) that is integrally formed with a shielding base part 104.

While the inventive concept has been particularly shown and described with reference to exemplary embodiments thereof, it will be understood that various changes in form and details may be made therein without departing from the spirit and scope of the following claims.

What is claimed is:

1. A magneto-resistive chip package comprising:
a circuit board;
a shielding body comprising a shielding base part positioned on a surface of the circuit board and a shielding intermediate part extending from one side of the shielding base part;
a magneto-resistive chip positioned on the shielding base part along a first direction that is perpendicular to the surface of the circuit board;
an internal connection part electrically connecting the magneto-resistive chip to the circuit board;
an encapsulation part including a first portion positioned on the magneto-resistive chip along the first direction and a second portion positioned on the circuit board along the first direction, wherein the encapsulation part encapsulates the magneto-resistive chip on the circuit board; and
a shielding cover positioned on the shielding intermediate part and on the encapsulation part such that the first portion of the encapsulation part is interposed between the magneto-resistive chip and the shielding cover along the first direction and such that the second portion of the encapsulation part is interposed between the circuit board and the shielding cover along the first direction,
wherein the shielding cover extends past a sidewall of the shielding intermediate part, and wherein a width of the shielding cover is substantially the same as a width of the circuit board in cross section.

2. The magneto-resistive chip package of claim 1, wherein the shielding intermediate part is comprised of a plurality of columns spaced apart from each other on one side of the shielding base part.

3. The magneto-resistive chip package of claim 1, wherein the shielding intermediate part comprises a single contiguous wall extending substantially entirely along one side of the shielding base part.

4. The magneto-resistive chip package of claim 1, wherein an upper surface of the shielding intermediate part is higher than an upper surface of the magneto-resistive chip.

5. The magneto-resistive chip package of claim 1, wherein the shielding cover is disposed over substantially the entire area of the circuit board by further extending beyond edge portions of the shielding base part and the shielding intermediate part.

6. The magneto-resistive chip package of claim 1, wherein the shielding base part, the shielding intermediate part, and the shielding cover constitute a shielding structure for protecting a magneto-resistive cell array of the magneto-resistive chip, wherein the shielding structure is a single layer of a magnetic material layer or a laminating layer in which a plurality of magnetic material layers and a plurality of non-magnetic material layers are sequentially stacked.

7. The magneto-resistive chip package of claim 1, further comprising an adhesion layer including a magnetic material positioned on an upper surface of the encapsulation part and on an upper surface of the shielding intermediate part, and wherein the shielding cover is positioned on the adhesion layer including the magnetic material.

8. The magneto-resistive chip package of claim 1, wherein the internal connection part comprise bonding wires that electrically connect the magneto-resistive chip to the circuit board.

9. The magneto-resistive chip package of claim 1, wherein the shielding base part and the circuit board are connected to each other through a ground connection part.

10. The magneto-resistive chip package of claim 1, wherein ends of the shielding cover extend past opposite edges of the shielding intermediate part.

11. A magneto-resistive chip package comprising:
a circuit board;
a shielding body arranged on the circuit board, the shielding body comprising a shielding base part and a shielding intermediate part extending from one side of the shielding base part, the shielding body having an opening formed through the shielding base part or through the shielding intermediate part;
a magneto-resistive chip arranged on the shielding base part, wherein magneto-resistive chip includes a first surface and a second surface opposite the first surface and wherein the first surface faces toward the shielding base part;
an internal connection part extending from the second surface of the magneto-resistive chip and electrically connecting the magneto-resistive chip to the circuit board through the opening;
an encapsulation part encapsulating the magneto-resistive chip on the circuit board; and
a shielding cover positioned on the shielding intermediate part,
wherein the shielding cover extends past a sidewall of the shielding intermediate part, and
wherein a width of the shielding cover is substantially the same as a width of the circuit board in cross section.

12. The package of claim 11, wherein the shielding cover is positioned on the encapsulation part.

13. The package of claim 12, wherein the shielding cover covers the internal connection part.

14. The package of claim 13, wherein the shielding intermediate part comprises a plurality of columns spaced apart from each other, and wherein the opening is defined between the plurality of columns.

15. The magneto-resistive chip package of claim 11, wherein a region of the circuit board is exposed by the opening, and wherein the internal connection part electrically contacts the region of the circuit board exposed by the opening.

16. A magneto-resistive chip package comprising:
a circuit board;
a shielding base part positioned on the circuit board and having a penetration hole through which the circuit board is exposed;
a magneto-resistive chip positioned on the shielding base part;
a shielding intermediate part provided on one side of the shielding base part and protruding higher than an upper surface of the magneto-resistive chip;
an internal connection part electrically connecting the magneto-resistive chip to the circuit board through the penetration hole;
an encapsulation part encapsulating the magneto-resistive chip on the circuit board; and
a shielding cover positioned on the shielding intermediate part and on the encapsulation part,
wherein the encapsulation part is interposed between the circuit board and the shielding cover,
wherein the shielding cover extends past a sidewall of the shielding immediate part, and
wherein a width of the shielding cover is substantially the same as a width of the circuit board in cross section.

17. The magneto-resistive chip package of claim 16, wherein the penetration hole is positioned on one side of the shielding base part, and wherein the internal connection part comprises bonding wires that electrically connect the magneto-resistive chip to the circuit board.

18. The magneto-resistive chip package of claim 16, wherein the penetration hole is positioned on one side of the shielding base part, wherein the magneto-resistive chip comprises a contact electrode as the internal connection part, and wherein the contact electrode is electrically connected to the circuit board through the penetration hole.

19. The magneto-resistive chip package of claim 16, wherein a plurality of the penetration holes are provided around a periphery of the shielding base part.

\* \* \* \* \*